United States Patent
Brocklesby et al.

(10) Patent No.: US 10,635,132 B1
(45) Date of Patent: Apr. 28, 2020

(54) PORTABLE INFORMATION HANDLING SYSTEM MANAGEMENT OF TRANSFORMATION BETWEEN CLAMSHELL AND ALL-IN-ONE POSITIONS

(71) Applicant: Dell Products L.P., Round Rock, TX (US)

(72) Inventors: Brandon J. Brocklesby, Pflugerville, TX (US); Priyank Gajiwala, Austin, TX (US); David J. Hernandez, Round Rock, TX (US); Robert D. Hrehor, Round Rock, TX (US); Jason S. Morrison, Chadron, NE (US); Laurent A. Regimbal, Georgetown, TX (US); Anthony J. Sanchez, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/263,624

(22) Filed: Jan. 31, 2019

(51) Int. Cl.
*G06F 1/16* (2006.01)
*H05K 5/02* (2006.01)

(52) U.S. Cl.
CPC .......... *G06F 1/1624* (2013.01); *G06F 1/1618* (2013.01); *G06F 1/1669* (2013.01); *G06F 1/1681* (2013.01); *H05K 5/0226* (2013.01); *H05K 5/0234* (2013.01)

(58) Field of Classification Search
CPC .... G06F 1/1675; G06F 1/1677; G06F 1/1679; G06F 3/01; G06F 3/02; G06F 3/0227
See application file for complete search history.

(56) References Cited

U.S. PATENT DOCUMENTS

| | | | |
|---|---|---|---|
| 5,196,993 A | 3/1993 | Herron et al. | |
| 6,198,624 B1 | 3/2001 | Margaritis | |
| 6,816,365 B2 | 11/2004 | Hill et al. | |
| 6,842,338 B2 | 1/2005 | Iredale | |
| 6,975,507 B2* | 12/2005 | Wang | G06F 1/1616 16/333 |
| 9,001,504 B2* | 4/2015 | Han | G06F 1/162 361/679.27 |
| 9,400,522 B2* | 7/2016 | Inami | G06F 3/1438 |
| 9,880,800 B1* | 1/2018 | Knepper | G06F 1/1647 |
| 2005/0253775 A1 | 11/2005 | Stewart | |
| 2007/0206349 A1 | 9/2007 | Jacobs | |
| 2012/0146915 A1* | 6/2012 | Chen | G06F 1/1616 345/169 |
| 2014/0063720 A1* | 3/2014 | Chang | G06F 1/1637 361/679.27 |
| 2015/0185866 A1* | 7/2015 | Im | G06F 1/162 345/168 |
| 2017/0003719 A1* | 1/2017 | Siddiqui | E05D 11/082 |
| 2017/0284457 A1* | 10/2017 | Park | F16C 11/103 |

(Continued)

*Primary Examiner* — Anthony Q Edwards
(74) *Attorney, Agent, or Firm* — Zagorin Cave LLP; Robert W. Holland

(57) ABSTRACT

A portable information handling system transformation between clamshell and all-in-one configurations is managed by a position manager that senses main and display housing positions to restrict configuration actions if predetermined conditions are detected. For example, transformation to an all-in-one configuration may be restricted if display housing location and rotational orientation are not set before extension of a stand that raises the main housing rear surface.

18 Claims, 27 Drawing Sheets

(56) References Cited

U.S. PATENT DOCUMENTS

2018/0210514 A1* 7/2018 Wang ................. G06F 1/1616
2018/0329667 A1* 11/2018 Sadak ................. G06F 3/1423
2019/0196552 A1* 6/2019 Wang ................. G06F 1/1669

* cited by examiner

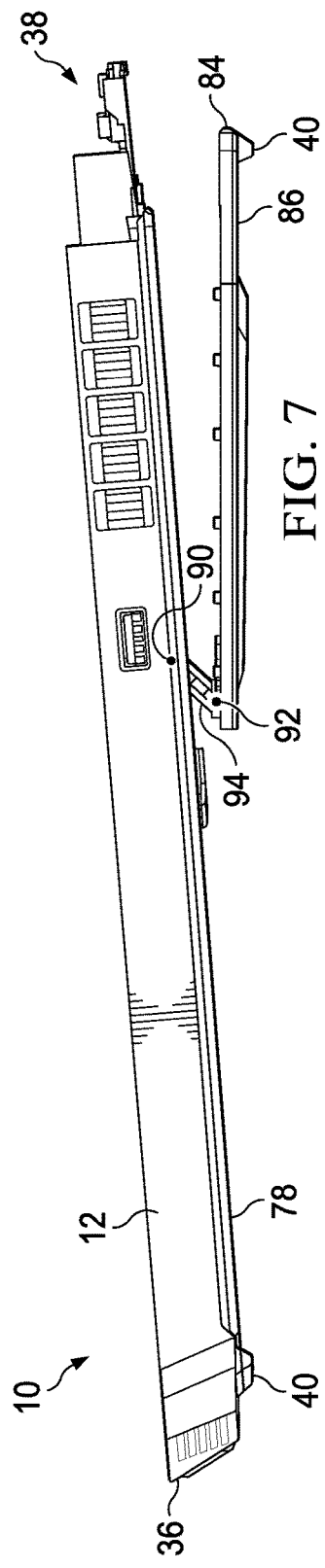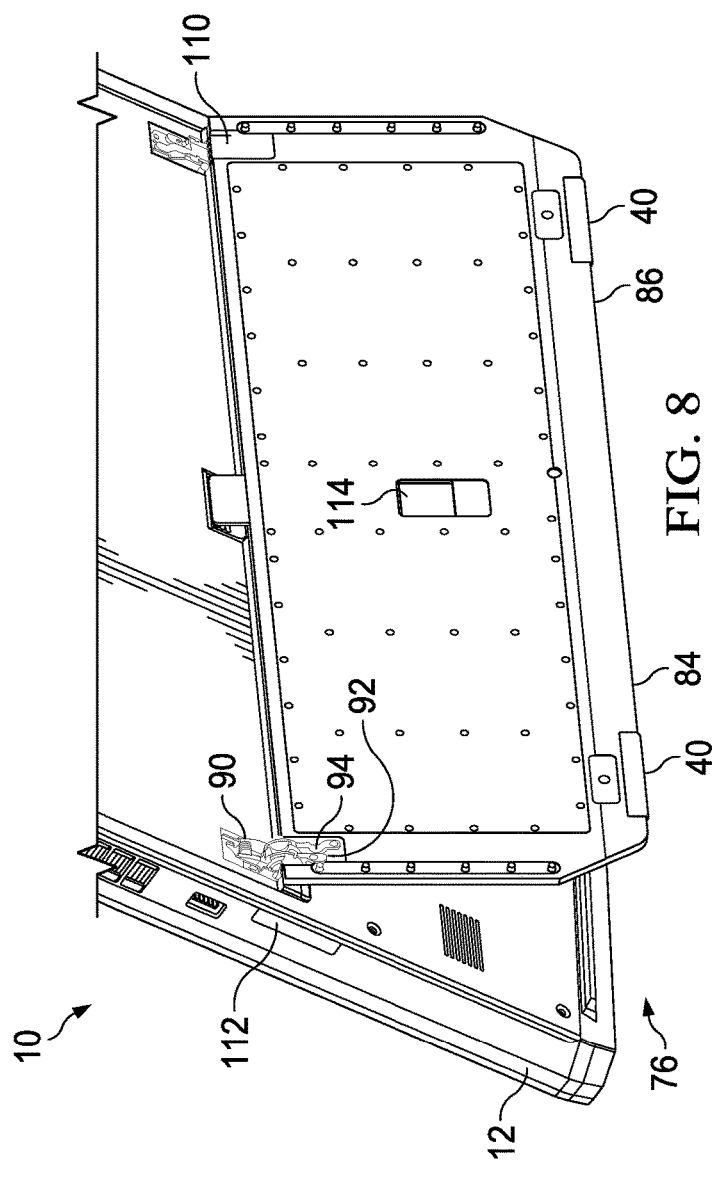

PORTABLE INFORMATION HANDLING SYSTEM MANAGEMENT OF TRANSFORMATION BETWEEN CLAMSHELL AND ALL-IN-ONE POSITIONS

CROSS REFERENCE TO RELATED APPLICATION

U.S. patent application Ser. No. 16/263,519, entitled "Transformative Information Handling System Adaptive Display Arrangement" by inventors Brandon Brocklesby, Priyank Gajiwala, David Hernandez, Robert Hrehor, Jason Morrison, Andy Regimbal and Anthony Sanchez, filed on Jan. 31, 2019, describes exemplary methods and systems and is incorporated by reference in its entirety.

U.S. patent application Ser. No. 16/263,557, entitled "Transformative Information Handling System Dual Axis Stand" by inventors Brandon Brocklesby, Priyank Gajiwala, David Hernandez, Robert Hrehor, Jason Morrison, Andy Regimbal and Anthony Sanchez, filed on Jan. 31, 2019, describes exemplary methods and systems and is incorporated by reference in its entirety.

U.S. patent application Ser. No. 16/263,594, entitled "Transformative Information Handling System Cable Management" by inventors Brandon Brocklesby, Priyank Gajiwala, David Hernandez, Robert Hrehor, Jason Morrison, Andy Regimbal and Anthony Sanchez, filed on Jan. 31, 2019, describes exemplary methods and systems and is incorporated by reference in its entirety.

U.S. patent application Ser. No. 16/263,652, entitled "Transformative Information Handling System Display Height Brake" by inventors Brandon Brocklesby, Priyank Gajiwala, David Hernandez, Robert Hrehor, Jason Morrison, Andy Regimbal and Anthony Sanchez, filed on Jan. 31, 2019, describes exemplary methods and systems and is incorporated by reference in its entirety.

BACKGROUND OF THE INVENTION

Field of the Invention

The present invention relates in general to the of portable information handling systems, and more particularly to a portable information handling system management of transformation between clamshell and all-in-one positions.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems generally integrate processing components, input/output (I/O) devices and a battery power source in a portable housing to support end user operation free from external resources, such as peripheral devices and an alternating current (AC) wall socket. One common portable information handling system configuration distributes components between main and lid housings that rotationally couple together with a hinge assembly. The main housing includes a processor and memory to execute instructions, such as an operating system and application, that process information. The lid housing integrates a display, such as a flat panel LCD or OLED display, that presents the information as visual images. A keyboard is disposed over the main housing portion to accept typed inputs by an end user. The main and lid housings close over top of each other to a closed position for improved portability when the portable information handling system is not in use. The main and lid housing portions rotate approximately 90 degrees relative to each other to a clamshell position that exposes the keyboard and display. In the clamshell position, the main housing holds the keyboard in a horizontal position to accept keyed inputs while also holding the display in a vertical position for viewing by an end user. Some portable information handling systems rotate the main and lid housings 360 degrees relative to each other to have a tablet position that exposes the display to accept touch inputs by the end user.

Generally, portable information handling systems sacrifice performance and ergonomics for portability. For instance, processing components included in portable information handling systems typically have reduced peak performance capabilities that help to reduce power consumption during battery operations. As an additional example, thermal management associated with power dissipation by processing components is typically sacrificed to some extent in order to reduce housing size and weight, which restricts airflow through the housing that aids thermal transfer. Usually, end users select display sizes adapted to their needs for viewing information versus portability and then the remaining features adapt to the display size. For instance, a smaller display size fits in a smaller housing for improved portability, however, the smaller housing that matches the display dimensions provides less room for including a keyboard and touchpad exposed to accept end user inputs.

Difficulties associated with portable information handling system interactions generally relate to the housing dimensions and the relative positioning of the lid and main housings in the clamshell position. For example, a display integrated in a lid housing that rotates at a hinge coupled to a main housing is held in a raised position that is below the eye level of the end user. The keyboard in the main housing is held in close proximity to the display and generally has a smaller footprint that makes end user inputs crowded in a small space. If an end user picks up the portable information handling system and holds the main housing in the end user's lap, thermal energy released by dissipation of power can create discomfort for the end user. Indeed, thermal energy exhausted from housing vents as heated airflow often blows across the end user's clothes and skin. An end user often can enhance interactions with external display, keyboard and mouse devices, however, when taken together with the portable housing itself, the system and peripheral devices collectively consume a larger desktop footprint. For example, an all-in-one information handling system that integrates processing components in a planar housing with a tablet form factor supports both the processing components and display in a vertical plane that leaves desktop space less crowded.

SUMMARY OF THE INVENTION

Therefore, a need has arisen for a system and method which transforms a portable information handling system having closed and open positions to an all-in-one position that improves end user interactivity.

In accordance with the present invention, a system and method are provided which substantially reduce the disadvantages and problems associated with previous methods and systems for interacting with a portable information handling system. A portable information handling system rotationally couples main and display housings with a hinge assembly at a pivot axis that slides between front and rear sides of the main housing. The portable information handling system transforms to an all-in-one position by sliding the pivot axis towards the front side and extending a stand from a lower surface of the main housing to elevate the rear side so that the position of the pivot axis defines the height of the display in a vertical plane.

More specifically, a portable information handling system processes information with processing components disposed in a main housing, such as a central processing unit (CPU) executing an operating system stored in random access memory (RAM) that generates visual information with a graphics processor unit (GPU) for presentation as visual images at a display panel integrated in a display housing. First and second hinges rotationally couple the display housing to the main housing about a pivot axis with the first and second hinges engaged in first and second guides defined in an upper surface of the main housing. The hinges slidingly engage the guides to slide the pivot axis between rear and front sides of the main housing. A keyboard attaches and detaches at the main housing upper surface to cover and uncover the guides. The portable information handling system transforms from a clamshell to an all-in-one position by detaching the keyboard and sliding the display housing pivot axis towards the front side of the main housing. The display housing rotates about the pivot axis by approximately 160 degrees and a stand extends from the lower surface of the main housing to raise the rear side of the main housing so that the display has a vertical viewing orientation as supported by the stand and the front side of the main housing resting on a support surface.

The present invention provides a number of important technical advantages. One example of an important technical advantage is that a portable information handling system transforms from a clamshell to an all-in-one form factor that leverages the main housing as part of a stand to hold a display in an adjustable vertical position. The raised display and detachable keyboard provide improved ergonomics that allow an end user to have a level viewing orientation relative to the display while typing inputs at a separated keyboard in a comfortable position. Raising the main housing as part of a stand exposes a greater surface area of the main housing to an external environment, which enhances thermal transfer. An end user having a desktop available can transform the portable information handling system to an all-in-one configuration that enhances user interactions, yet can still have a clamshell position available for improved mobility.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 7 depicts a side view of an information handling system having a stand partially extended to raise a main housing for more ergonomic typed inputs;

FIG. 8 depicts a rear view of an information handling system main housing held in a raised position by a stand that extends outward from a lower surface;

DETAILED DESCRIPTION

A portable information handling system transforms between a closed position to an all-in-one position having an integrated display in a display housing elevated to a raised position by a stand extending from a main housing where the display housing remains rotationally coupled to the main housing during transformation from the closed to the all-in-one position. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
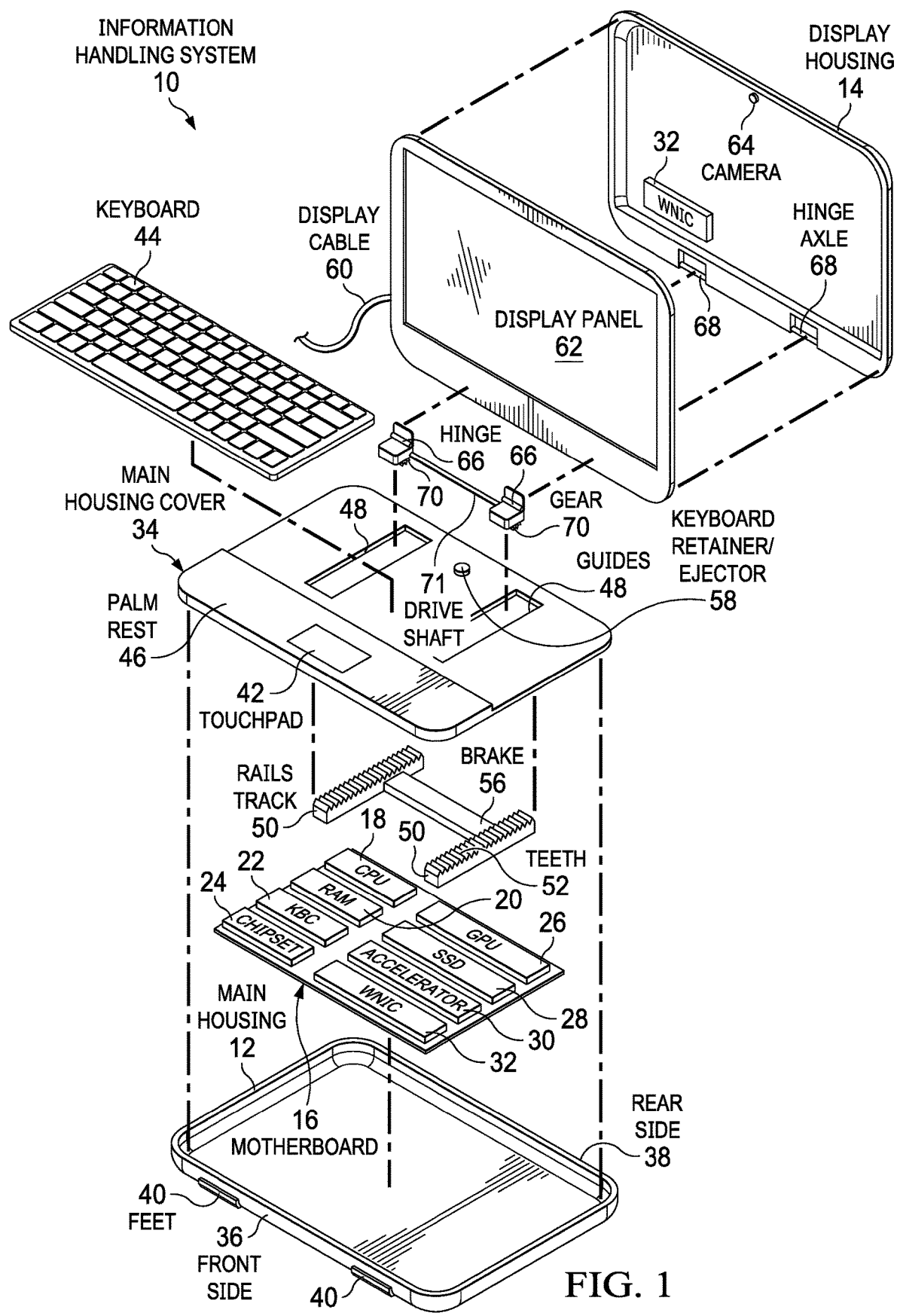
FIG. 1 depicts an exploded view of a portable information handling system having an adaptive display arrangement.

Referring now to FIG. 1, an exploded view depicts a portable information handling system 10 having an adaptive display arrangement. A main housing 12 provides space to hold processing components that process information and a display housing 14 provides a structure to support a display for presenting information as visual images. In the example embodiment, a motherboard 16 couples into main housing 12 to provide a communication and power interface for the processing components. For instance, a central processing unit (CPU) 18 executes instructions stored in random access memory (RAM) 20 to process information, such as instructions of an operating system and applications. A keyboard controller (KBC) 22 includes embedded code stored in flash memory as firmware that executes to provide management of I/O devices and power. A chipset 24 manages operations of CPU 18, such as clock speed, power consumption and memory accesses to support communications with a graphics processor unit (GPU) 26. GPU 26 processes visual information to generate pixel values that define colors present at pixels of a display panel 62. A solid state drive (SSD) 28 provides persistent memory to store non-transitory information during power down of the system. Accelerometers 30 detect accelerations of main housing 12, including gyroscopic inputs related to rotation of main housing 12 and display housing 14. A wireless network interface card (WNIC) 32 provides wireless communication, such as by a wireless local area network (WLAN), wireless personal area network (WPAN), and wireless wide area network (WWAN). The processing components depicted as coupled to motherboard 16 provide an example of some components found in conventional information handling systems and those skilled in the art will recognize that a wide variety of these and other processing components may be used in alternative embodiments.

A main housing cover 34 fits over motherboard 16 and main housing 12 to capture and protect the processing components in a portable configuration. In the example embodiment, a front side 36 of main housing 12 couples to a front side of main housing cover 34 where a touchpad 42 is located to accept touch inputs that adjust a cursor presented by display panel 62. Feet integrated in front side 36 of main housing 12 provide a buffer to contact with a support surface both at front side 36 and at the bottom surface of main housing 12. Main cover 34 couples at the rear side 38 of main housing 12 to include a structure that accepts a detachable keyboard 44, such as a cavity formed in the upper surface of main housing cover 34. For instance, the cavity is defined in part by a palm rest 46 that has a raised surface to aid end user typing at keyboard 44 when installed in the cavity of main housing cover 34. Keyboard 44 may interface with keyboard controller 22 through a cable or wireless interfaces supported by WNIC 32.

To support transformation between clamshell and all-in-one positions, main housing cover 34 has dual parallel spaced guides 48 running in the keyboard 44 cavity from the base of palm rest 46 to rear side 38 of main housing cover 34. A rail track 50 couples to the inner side of main housing cover 34 under each guide 48 to align teeth 52 with guides 48 so that a geared wheel inserted in each guide 48 will travel in a defined manner through each guide 48. A brake 56 selectively engages with rail tracks 50 to slow, stop and release a geared wheel inserted in each guide 48. As described in greater detail below, keyboard 44 is released from main housing cover 34 to expose guides 48 and allow movement of geared wheels along rail tracks 50. A keyboard retainer/ejector 58 aids in attachment and detachment of keyboard 44 at the upper surface of main hinge cover 34. For example, keyboard retainer/ejector 58 is a solenoid or heat activated superelastic material that interacts with keyboard 44 based upon commands received from keyboard controller 22.

In the example embodiment, display panel 62 interfaces with GPU 26 through a cable 60 and couples into display housing 14. Display housing 14 includes a camera 64 to capture visual images of an area in front of display panel 62, and WNIC 32 to support wireless communication, and one or more accelerometers 30 that detect accelerations of display housing 14. Display housing 14 couples to hinges 66 with a hinge axle 68 so that display housing 14 rotates about hinge axle 68. A gear 70 coupled to each hinge 66 has gear teeth sized to couple with teeth 52 integrated in rail tracks 50. In summary, display housing 14 couples to main housing 12 through hinges 66, which have gears 70 engaged with teeth 52 through guides 48. This assembly allows display housing 14 to move across the upper surface of main housing cover 34 when keyboard 44 is removed from main cover 34. In addition, display housing 14 rotates about hinge axle 68 between a closed position having display panel 62 against keyboard 44 and an open position having display panel 62 in a clamshell position. Coordination of sliding and rotating motions of display housing 14 is provided by mechanical interactions, such as by brake 56, and controller interactions, such as keyboard controller 22, so that transformation between closed, clamshell and all-in-one positions is supported in an effective and manageable manner. Brake 56 maintains display housing 14 parallel to front side 36 and rear side 38 of main housing 12 by synchronizing sliding motion of display housing 14 along rail tracks 50 with a drive axle 71 coupled to each gear 70 to transfer rotation between each gear 70. In alternative embodiments, alternative structures may be used to coordinate sliding motion of display housing 14 between front side 36 and rear side 38 of main housing 12, such as various slot arrangements.

Figure 2:
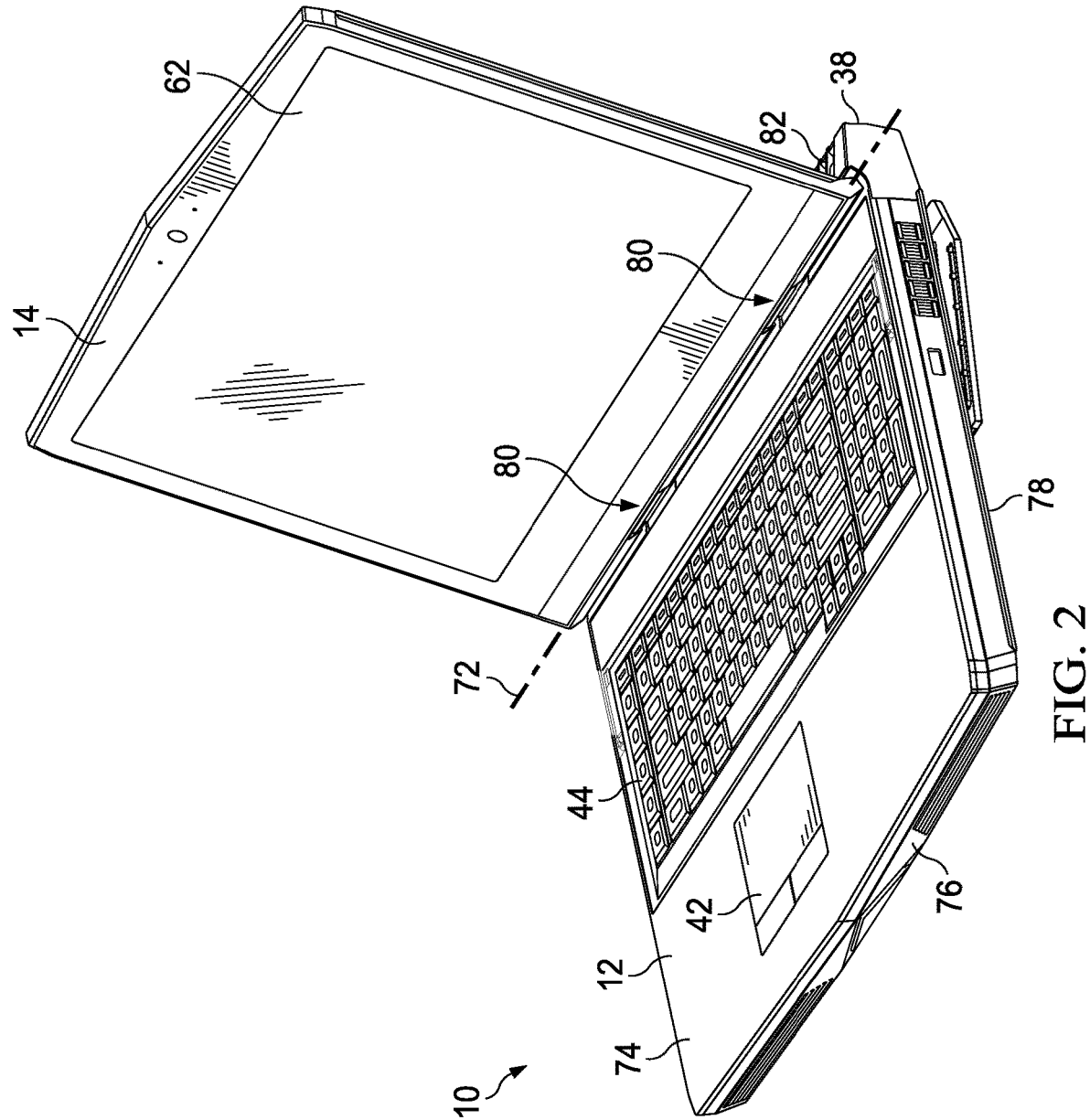
FIG. 2 depicts a portable information handling system with a display housing rotated to a clamshell position.

Referring now to FIG. 2, a portable information handling system 10 is depicted with a display housing rotated to a clamshell position. Main housing 12 lower surface 78 rests on a support surface 76, such as a desktop. Display housing 14 rotates up and away from main housing 12 upper surface 74 for approximately 90 degrees about a pivot axis 72 aligned with hinge assembly 80. In the clamshell position, keyboard 44 and touchpad 72 are exposed to accept end user inputs while display 62 is held in a viewing position. Vents 82 are disposed at the rear side 38 of main housing 12 to expel thermal energy through a cooling airflow, such as is generated by a cooling fan within main housing 12. Although the clamshell position provides convenient access to keyboard 44 while viewing display 62, end user interactions are somewhat constrained by the structural relationship of main housing 12 and display housing 14 through hinge assembly 80.

Figure 3:
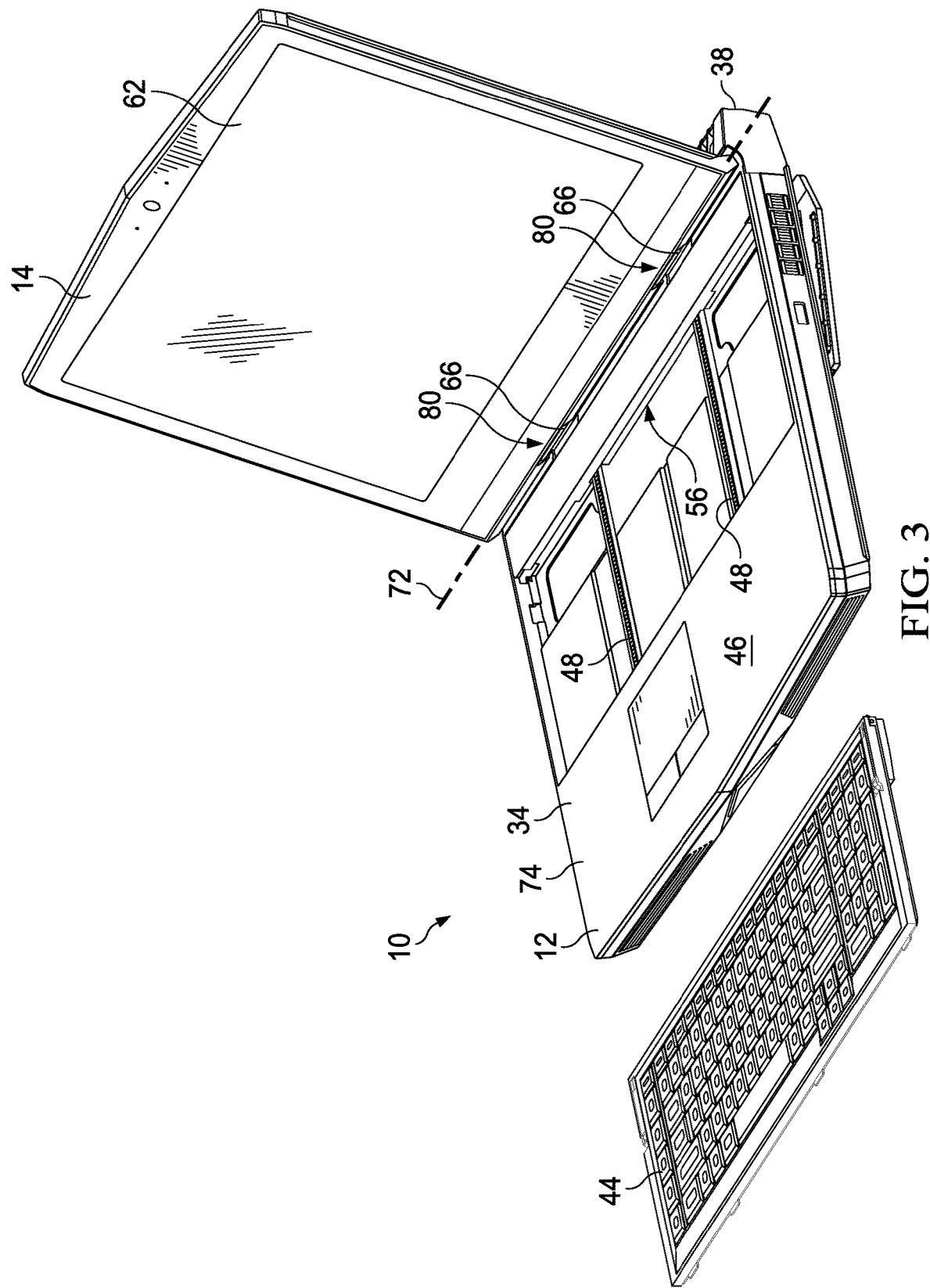
FIG. 3 depicts a portable information handling system in the clamshell position with the keyboard removed from the upper surface of the main housing.

Referring now to FIG. 3, a portable information handling system 10 is depicted in the clamshell position with keyboard 44 removed from the upper surface 74 of main housing 12. Keyboard 44 is sized to fit in the cavity defined in the upper surface 74 of main housing cover 34 between palm rest 46 and rear side 38. Under keyboard 44, guides 48 are formed and coupled in a sliding relationship with hinges 66 of hinge assembly 80 so that display housing 14 can slide from the rear side 38 of main housing 12 to the base of palm rest 46. Removing keyboard 44 opens guides 48 to permit sliding motion of display housing 14 across uppers surface 76 of main housing cover 34. In various embodiments, rotating and sliding motion are managed in a cooperative manner, such as by brake 56 that interfaces with rail tracks 50 and hinge assembly 80. For instance, keyboard 44 may automatically pop out if display housing 14 rotates some amount past 90 degrees, which indicates further configuration changes as described below. Hinge assembly 80 may remain locked in position unless keyboard 44 is removed and/or display housing 14 rotates some amount past 90 degrees. Other various restrictions on relative motion of housing components may be enforced in various embodiments.

Figure 4:
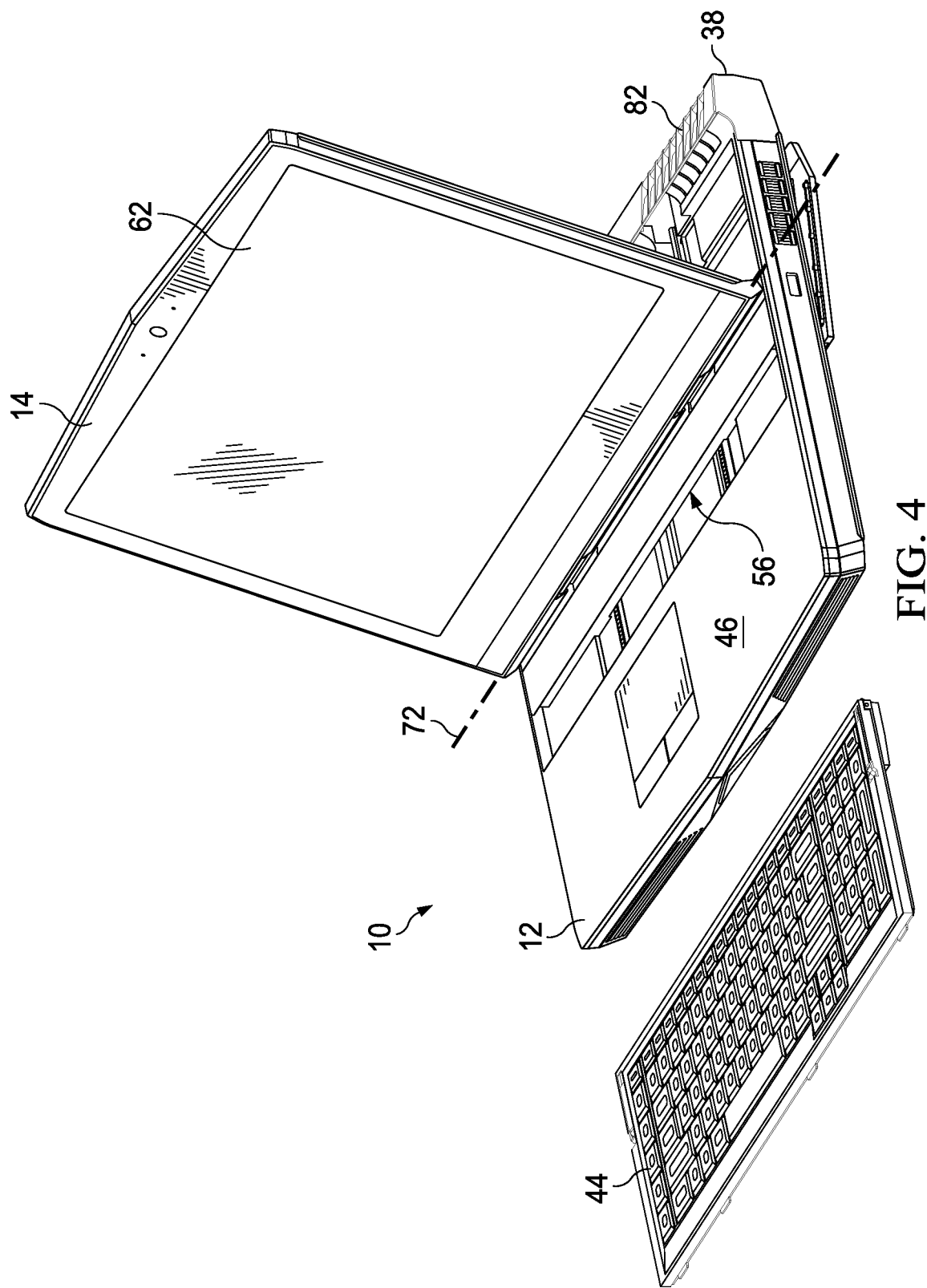
FIG. 4 depicts a portable information handling system in the clamshell position with a display housing slid from a rear side position towards a palm rest to bring a display closer to the front side of the main housing.

Referring now to FIG. 4, a portable information handling system 10 is depicted in the clamshell position with a display housing 14 slid from a rear side 38 position towards a palm rest 46 to bring display 62 closer to the front side 36 of main housing 12. In the example embodiment, display housing 14 slides its pivot axis 72 forward towards palm rest 46. Pivot axis 72 remains parallel to rear side 38 and front side 36 while sliding backwards and forwards. For example, brake 56 synchronizes motion between two parallel spaced rail tracks 50. Synchronized motion may be provided with synchronized rotation of gears that engage rail tracks 50 or by engagement of brake 56 against opposing sides of main housing 12. In alternative embodiments, a single sliding attachment may be used to guide sliding motion of lid housing 14 so that, for instance, some rotation of display housing 14 along a vertical axis is supported. Pivot axis 72 has slid forward to a central location of main housing 12. As described below, the sliding position of display housing 14 provides variations in height of display 62 when main housing 12 transforms into a stand. In one embodiment, brake 56 locks the sliding position of pivot axis 72 when display housing 14 rotates a defined amount past 90 degrees. As described below, the sliding position of pivot axis 72 may also act to unlock a stand in main housing 12 that allows rear side 38 of main housing 12 to lift to a stand position. For example, sliding display housing 14 towards palm rest tends to lower the center of gravity of information handling system 10 in the transformed stand position. In addition, as display housing 14 slides away from vents 82, thermal exchange efficiency improves with less resistance to airflow exiting or entering information handling system 10 at vents 82. Further, venting to intake and/or exhaust airflow for cooling may also become exposed by removing keyboard 44 and, as described below, raising the rear side 38 or main housing 12. In one embodiment, keyboard controller 22 manages a thermal exchange algorithm that takes into account improved thermal transfer efficiency due to display housing 14 sliding location, such as may be used to run at a higher system clock speed or higher operating temperature.

Figure 5:
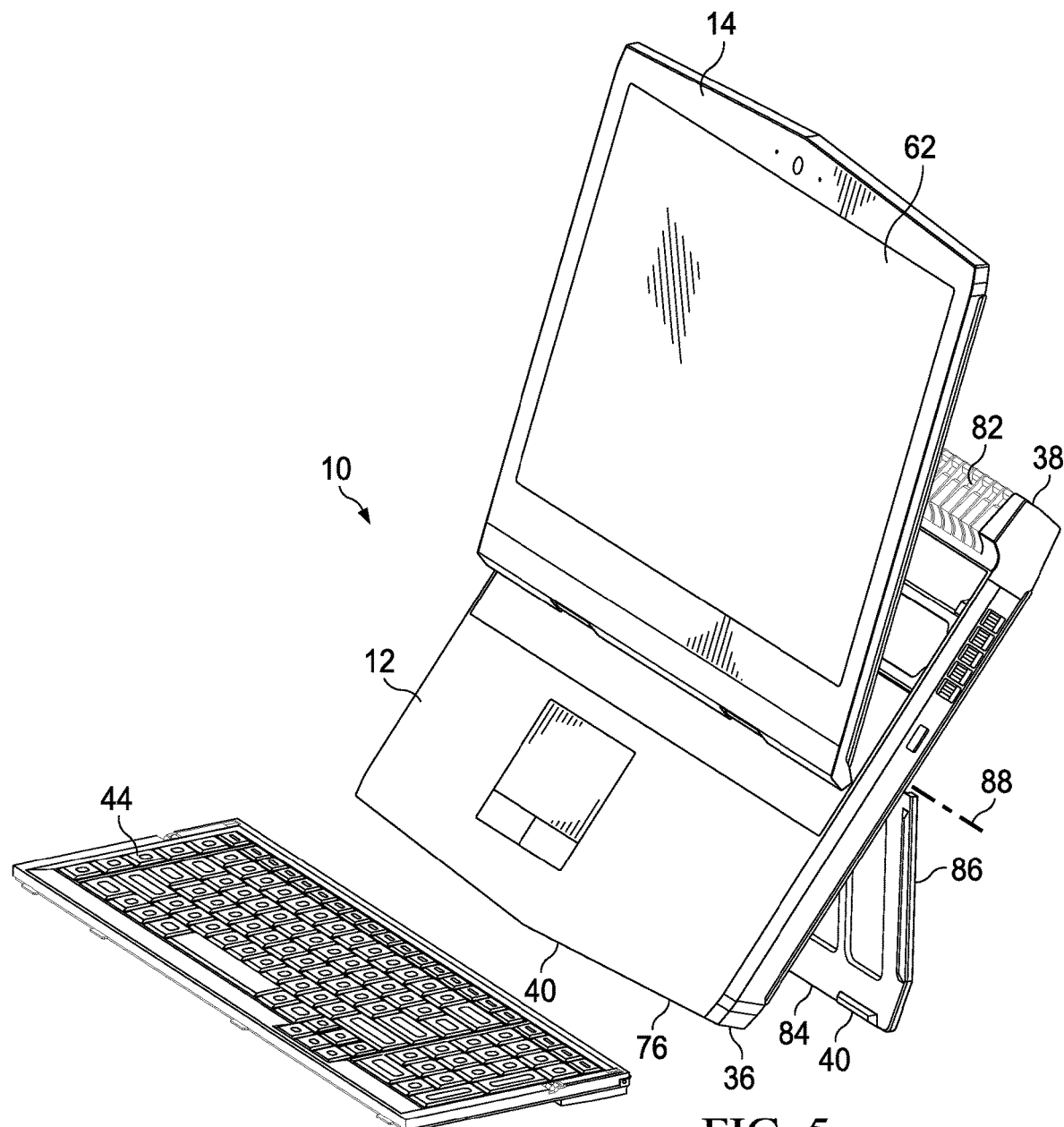
FIG. 5 depicts a portable information handling system with the main housing raised for use as a stand that elevates the display in an all-in-one position.

Referring now to FIG. 5, portable information handling system 10 is depicted with the main housing 12 raised for use as a stand that elevates the display 62 in an all-in-one position. To achieve the all-in-one position, the pivot axis 72 is slid from the rear side 38 towards the front side 36 of main housing 12 as shown in FIG. 4, and the rear side 38 of main housing 12 is raised to extend a stand 86 from lower surface 78 of main housing 12 to rest against support surface 76. Information handling system 10 front side 36 feet 40 rest against support surface 76 along with supporting end 84 of stand 86 to hold a substantially vertical orientation that raises display 62 to eye level of a user sitting next to a desktop support surface 76. In the example embodiment, stand axis 88 about which stand 86 rotates is located above pivot axis 72 to aid in keeping a low enough center of gravity for stability of the vertical orientation. Display housing 14 rotates relative to main housing 12 by approximately 160 degrees so that display panel 62 is held in a substantially vertical orientation. Display housing 14 may rotate about pivot axis 72 to adjust end user viewing angle and may slide in guides 48 to adjust end user viewing height. That is, although the all-in-one position has display panel 62 in a substantially vertical position held raised by main housing 12 in a substantially vertical position, the precise viewing angle may be adjusted to adapt to end user needs. In various embodiments, different relationships for the relative positions of pivot axis 72 and stand axis 88 may be used. In one example embodiment, stand 86 may be restricted from rotation out to an extended position if pivot axis 72 is too close to rear side 38. In another embodiment, display housing 14 may be restricted from sliding along guides 48 if stand 86 is extended. Alternatively, display housing 14 may slide in guides 48 when stand 86 is extended but only to a limited height associated with a desired center of gravity and stability. In the vertically oriented all-in-one position illustrated by FIG. 5, information handling system 10 has improved thermal transfer capabilities, a reduce desktop footprint and a raised display 62 that is easier for an end user to see while inputting at a detached keyboard 44.

Once stand 86 deploys to hold main housing 12 in a substantially vertical alignment as depicted by FIG. 5, information handling system 10 improves rejection of excess thermal energy in several ways. Generally, exposing a larger surface area by the vertical orientation of main housing 12 improves thermal rejection to the external environment through nominal passive transfer. In addition, greater cooling airflow is provided with reduced airflow impedance as intakes at a lower surface of main housing 12 are held away from a support surface that otherwise interferes with airflow into main housing 12. Further, removal of keyboard 44 exposes additional areas at which cooling airflow may enter or exit main housing 12, such as the upper surface 74 of main housing cover 34 located behind lid housing 14. Improved thermal rejection allows information handling system 10 to operate at higher clock speeds that tend to generate greater amounts of excess thermal energy. Thus, upon detection of sliding of lid housing 14 towards front side 36 of main housing 12 and/or elevation of main housing 12 by stand 86, processor over clocking may be automatically authorized where needed, such as during operation or processor intensive gaming applications. Further, an alternative thermal profile may be employed that recognizes different temperature constraints within main housing 12.

Figure 6A:
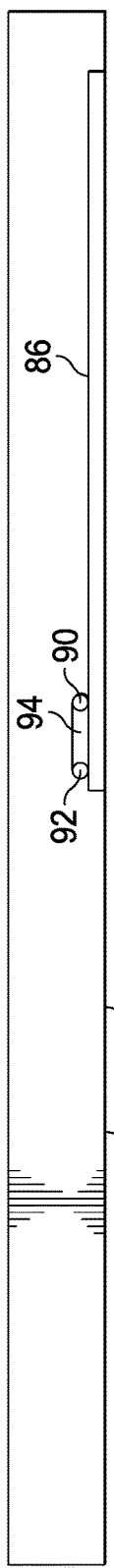
FIGS. 6A, 6B and 6C depict a side view of a two axis hidden hinge kickstand.
Figure 6B:
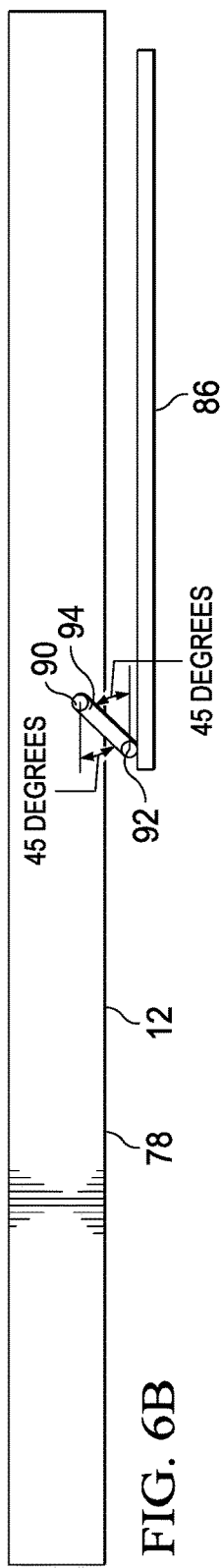
Figure 6C:
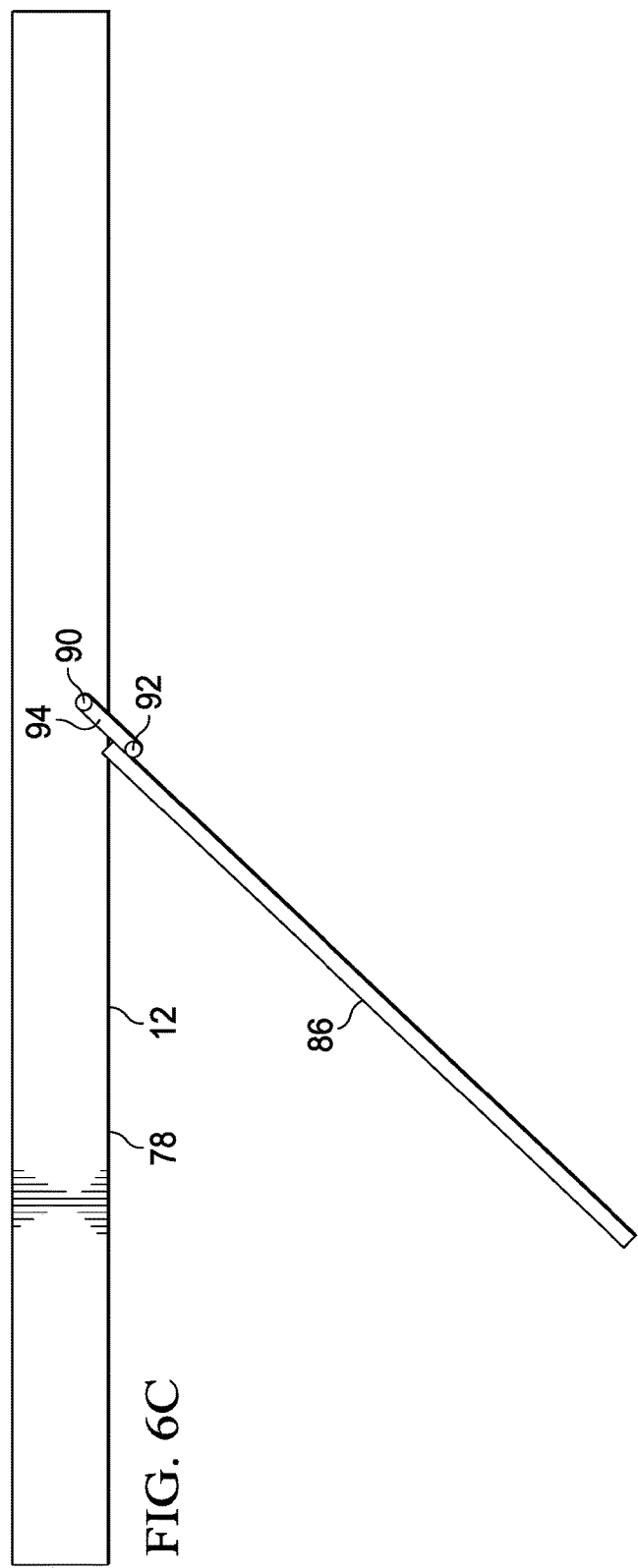

Referring now to FIGS. 6A, 6B and 6C, a side view depicts a two axis hidden hinge kickstand. Rotation of stand 86 at a center location of lower surface 78 about a single axis typically includes a swept volume that results in a large cutout at lower surface 78 to manage hinge motion. The dual axis hinge shown in the example embodiment of FIGS. 6A-6C reduce the amount of space at lower surface 78 by rotating about a main housing axle 90 and a stand axle 92. In the example embodiment, from a withdrawn position of FIG. 6A, simultaneous synchronized rotation in opposing directions takes place about main housing axle 90 and stand axle 92 for approximately 45 degrees each, resulting in stand 86 having a parallel alignment to main housing lower surface 78 as depicted by FIG. 6B. After the initial 45 degrees of rotation, main housing axle 90 holds its rotational orientation while stand axle 92 completes a total of 180 degrees of rotation as depicted by FIG. 6C. To retract stand 86, a reverse rotation takes place by rotation 135 degrees about stand axle 92 to the configuration of FIG. 6B, then dual opposing rotation about both axis 90 and 92 to the withdrawn position of FIG. 6A. The dual axis rotation of stand 86 eliminates the swept volume problem associated with a central axis rotation by moving the primary rotation point outward of lower surface 78 during the initial rotation sequence. In addition, the initial synchronized opposing rotation places stand 86 in a slightly raised position that aids ergonomics for typing inputs at keyboard 44 when installed in main housing 12.

Referring now to FIG. 7, a side view depicts information handling system 10 having stand 86 partially extended to raise main housing 12 for more ergonomic typed inputs. In the example embodiment, keyboard 44 remains installed in main housing 12 with lower surface 78 raised above support surface 76 at rear side 38 and resting on feet 40 at front side 36. Stand hinge 94 has completed its dual opposed initial rotation to align stand 86 parallel with support surface 76. To achieve a parallel alignment, an initial rotation of 45 degrees is performed at main housing axle 90 and 50 degrees of rotation is performed at stand axle 92. A foot 40 at support end 84 of stand 86 rests on support surface 76 and extends off the end of stand 86 to act as a rest when stand 86 fully rotates to a stand position. The 45 and 50 degrees of rotation may result in an automated manner at completion of initial rotation or be selected with a lock that interacts with stand hinge 94.

Referring now to FIG. 8, a rear view depicts information handling system 10 main housing 12 held in a raised position by stand 86 extending outward from lower surface 78. A lock 110 integrates in stand 86 to hold the extended position until released, such as with a display brake release 112 disposed on the side of main housing 12 or a release 114 located at a middle position of stand 86. In various embodiments, display brake release 112 is pressed to allow adjustment of display height, such as by sliding hinges 66 within guides 48. The rear view of stand 86 depicts feet 40 at supporting end 84 that provide a dual purpose of supporting information handling system 10 both with the stand 86 extended and retracted. Each foot 40 has a rubberized outer surface that engages support surface 76 at both a clamshell and an all-in-one configuration.

Figure 9:
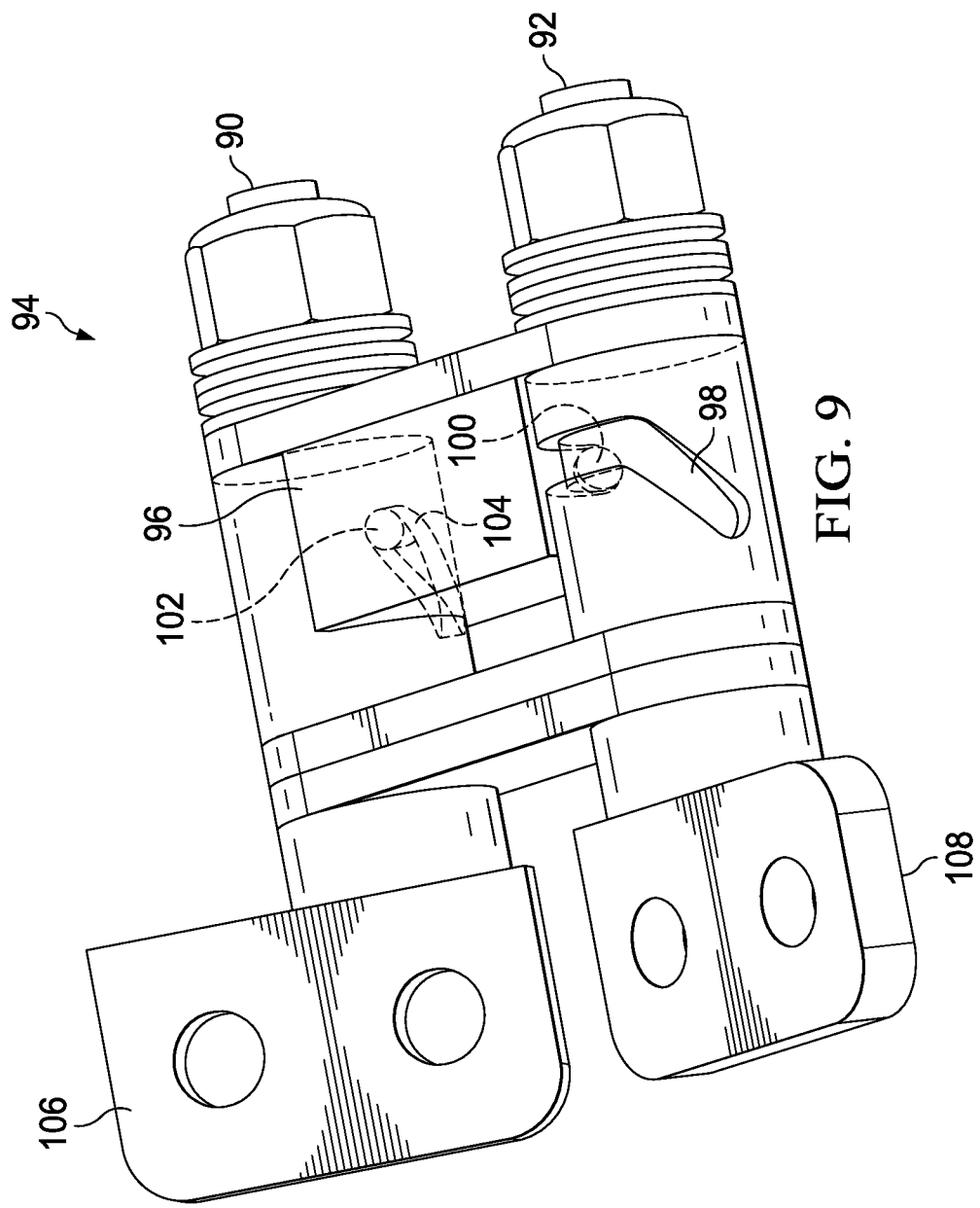
FIG. 9 depicts an upper perspective view of an example stand hinge that provides opposing dual axis rotation to a first rotational orientation followed by single axis rotation to a second rotational orientation.

Referring now to FIG. 9, an upper perspective view depicts an example stand hinge 94 that provides opposing dual axis rotation to a first rotational orientation followed by single axis rotation to a second rotational orientation. Stand hinge 94 has a main housing axle 90 and stand axle 92 held in a hinge body 96, which slides along axles 90 and 92 to manage hinge orientation. A stand axle helical slot 98 is formed in stand axle 92 and engaged with a stand axle pin 100 that supports 180 degrees of axle rotation. A main axle pin 102 extends from hinge body 96 into a main axle helical slot 104 to support 45 degrees of rotation of main axle 96. Angled portions of stand axle helical slot 98 and main axle helical slot 104 coordinate a sliding motion of hinge body 96 that synchronizes opposing rotation at main housing bracket 106 and stand bracket 108. The straight portion of stand axle helical slot 98 provides rotation of stand axle 92 while main housing axle 90 remains stationary. In an alternative embodiment, hinge body 96 may form the helical slots and engage with pins extending from the hinge and stand axles.

Figure 10:
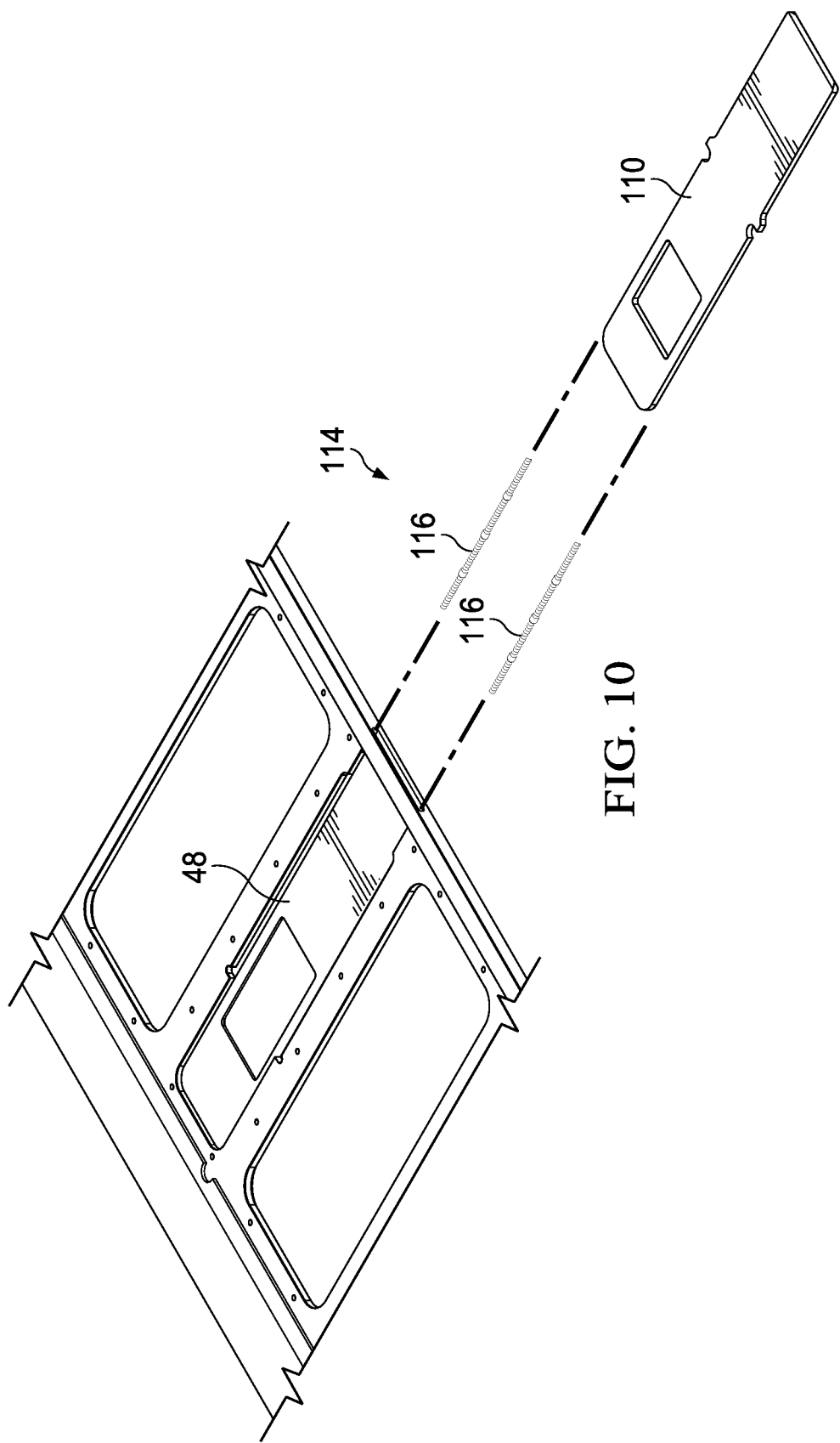
FIG. 10 depicts an exploded view of a stand as an example embodiment of a lock release to selectively lock and release a stand in the extended position.

Referring now to FIG. 10 an exploded view of stand 86 depicts an example embodiment of a lock release 114 to selectively lock and release stand 86 in the extended position. In the example embodiment, a lock 110 extends in and out of a guide 48 formed in stand 86 to extend upward from stand 86 and into main housing lower surface 78. A spring 116 biases lock outward from guide 48 to maintain contact with main housing 12. An opening formed in lock 110 and guide 48 provides access for an end user finger to slide lock 110 away from lower surface 78 so that stand 86 is released to rotate from the extended to the retracted position.

Figure 11:
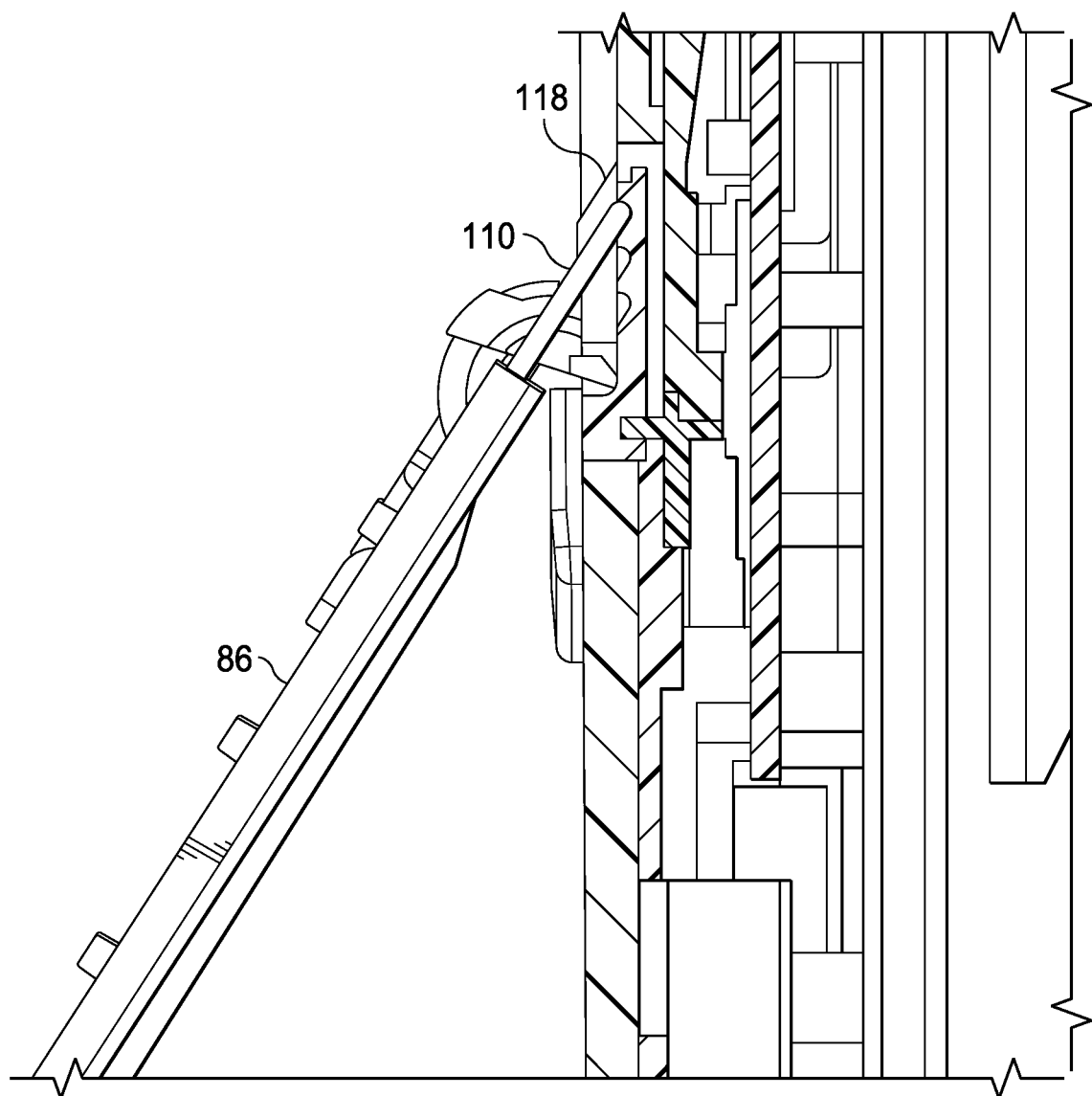
FIG. 11 depicts a side cutaway view of a stand engaged in a locked position by a stand retainer.

Referring now to FIG. 11, a side cutaway view depicts stand 86 engaged in a locked position by a stand retainer 118. Spring 116 biases lock 110 upward and into main housing 12 as described above. Stand retainer 118 has a cam surface engaged by lock 110 that resists rotation. A torque on stand 86, such as resulting from it resting on a support surface 76, causes a force perpendicular to lock 110's sliding motion so that movement of stand 86 is prevented. Pulling downward on lock 110 at release 114 frees the end of lock 110 from stand retainer 118 to allow rotation of stand 86.

Figure 12A:
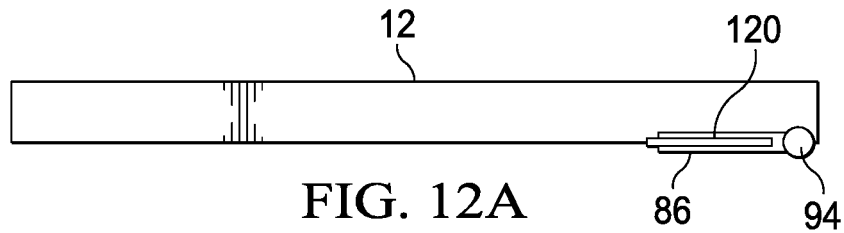
FIGS. 12A, 12B and 12C depict an alternative embodiment of a stand having extension by a sliding member.
Figure 12B:
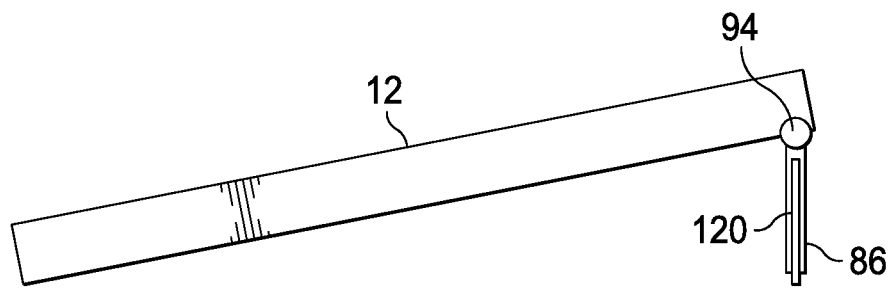
Figure 12C:
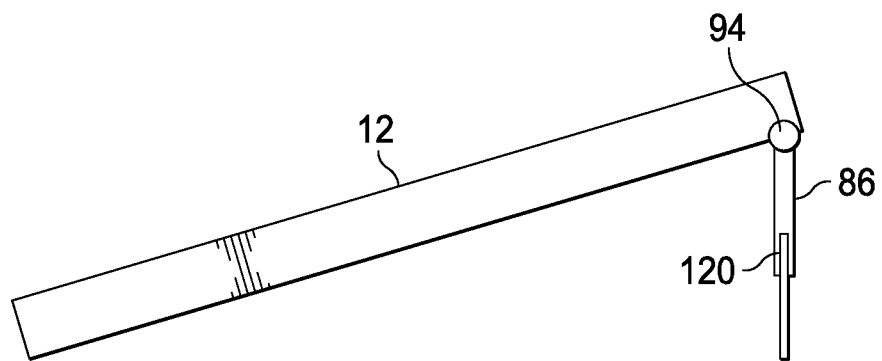

Referring now to FIGS. 12A, 12B and 12C, an alternative embodiment of stand 86 depicts extension by a sliding member 120. Stand 86 rotates from a retracted position depicted by FIG. 12A about stand hinge 94 to raise rear side 38 of main housing 12 and expose a sliding member 120 stored within stand 86. Sliding member 120 extends outward to further raise rear side 38 of main housing 12 as shown by FIGS. 12B and 12C. In the example embodiment, stand hinge 94 is located proximate rear side 38 of main housing 12, although in alternative embodiments stand hinge 94 may be located in a more central position on lower surface 78 of main housing 12. In the example embodiment, a single sliding member 120 is depicted, however, alternative embodiments may include multiple sliding members. Further, stand 86 may have separate members on opposite sides of main housing 12, or may be one solid stand piece that extends between opposing sides of main housing 12.

Figure 13A:
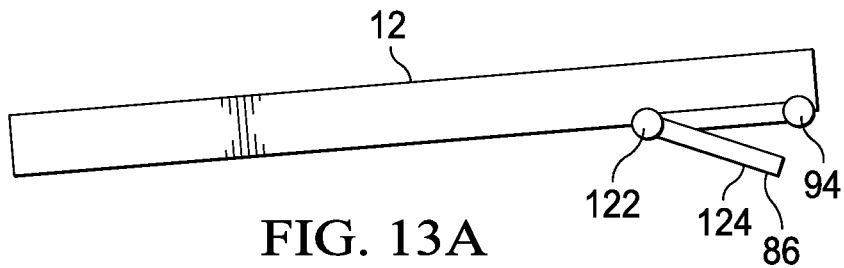
FIGS. 13A, 13B and 13C depict another alternative embodiment of a stand having extension by a secondary rotating member.
Figure 13B:
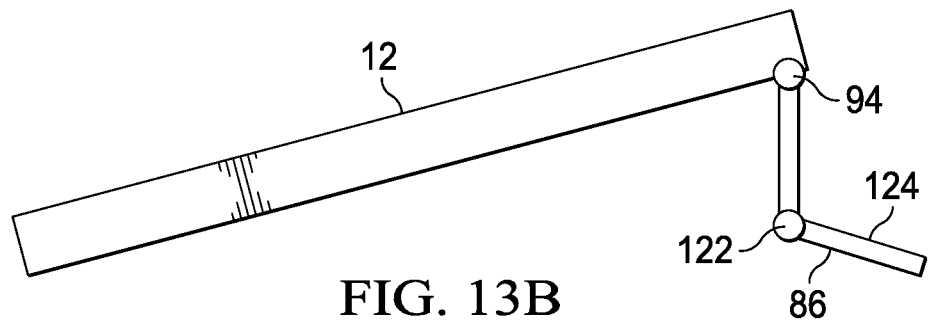
Figure 13C:
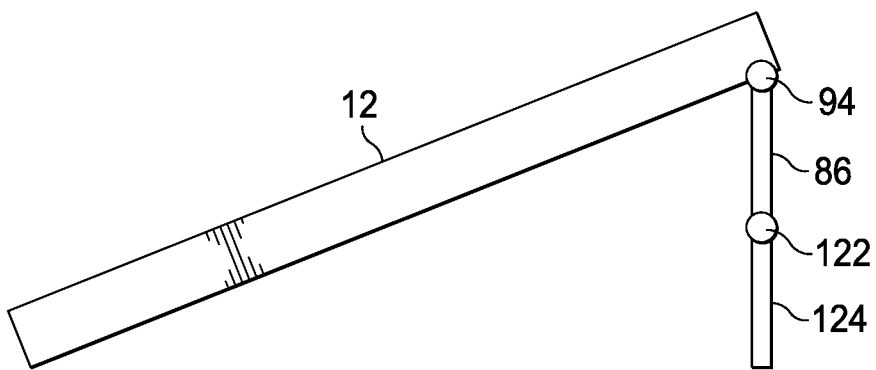

Referring now to FIGS. 13A, 13B and 13C, another alternative embodiment of stand 86 depicts extension by a secondary rotating member 124. Stand 86 rotates about stand hinge 94 from a retracted position depicted by FIG. 13A to an extended position depicted by FIGS. 13B and 13C, with rotating member 124 separately rotating about stand pivot 122 to fully extend as depicted by FIG. 13C. Stand hinge 94 may be located at a more central position of lower surface 78 of main housing 12. In alternative embodiments, multiple stand pivots may be used to adjust the stand elevation height. Stand 86 may have separate rotating members 124 on opposing sides of main housing 12 or may have a solid single member that extends between opposing sides of main housing 12. Different amounts of rotation about stand hinge 94 and/or stand pivot 122 may adjust the amount of height to which information handling system 10 is raised.

Figure 14A:
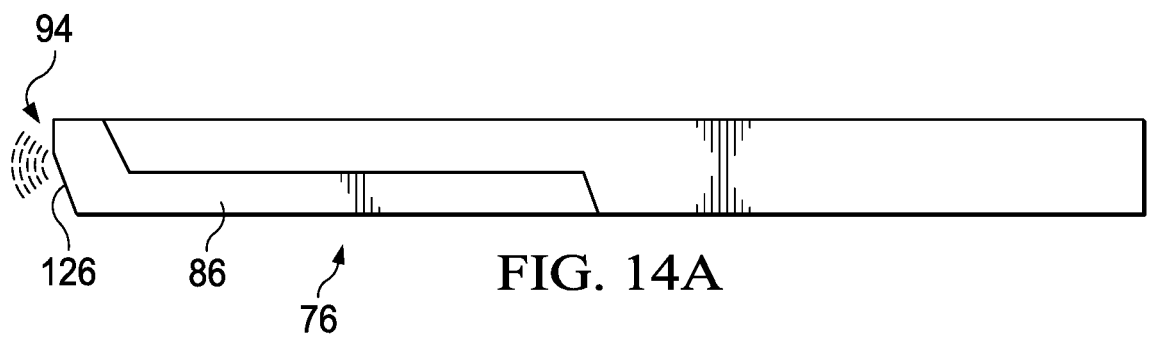
FIGS. 14A, 14B and 14C depict another alternative embodiment of a stand having extension about a stand hinge located at a front side of a main housing.
Figure 14B:
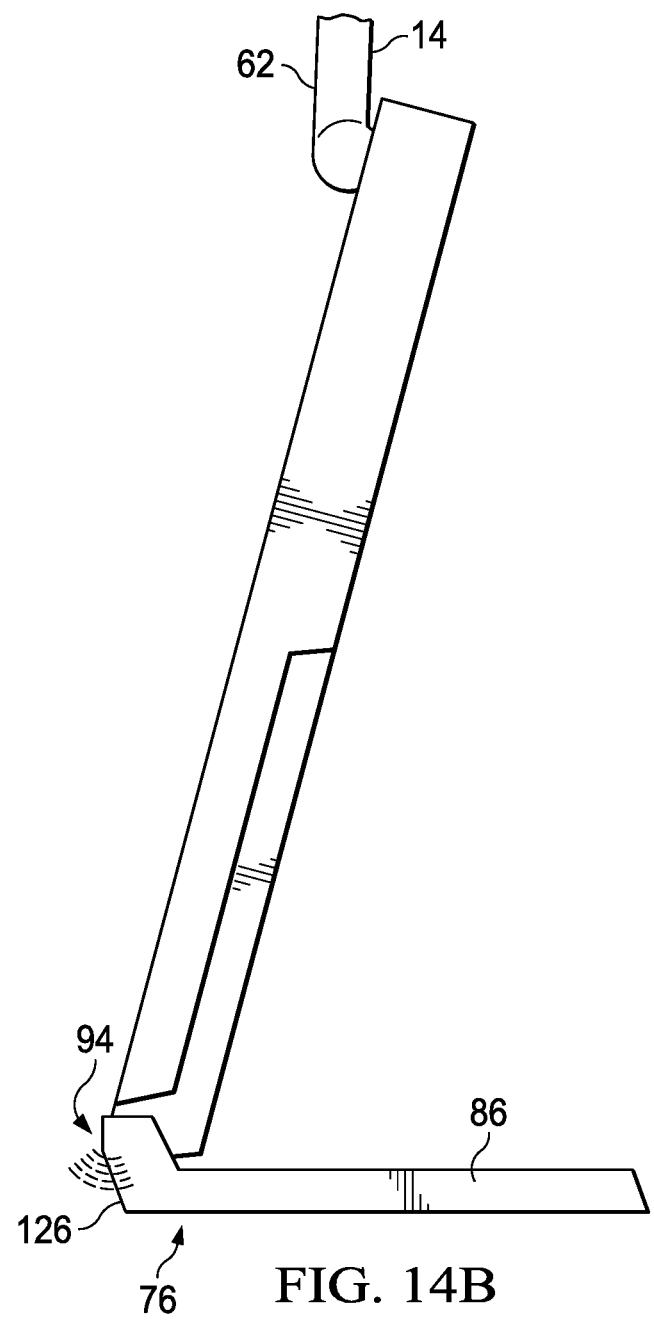
Figure 14C:
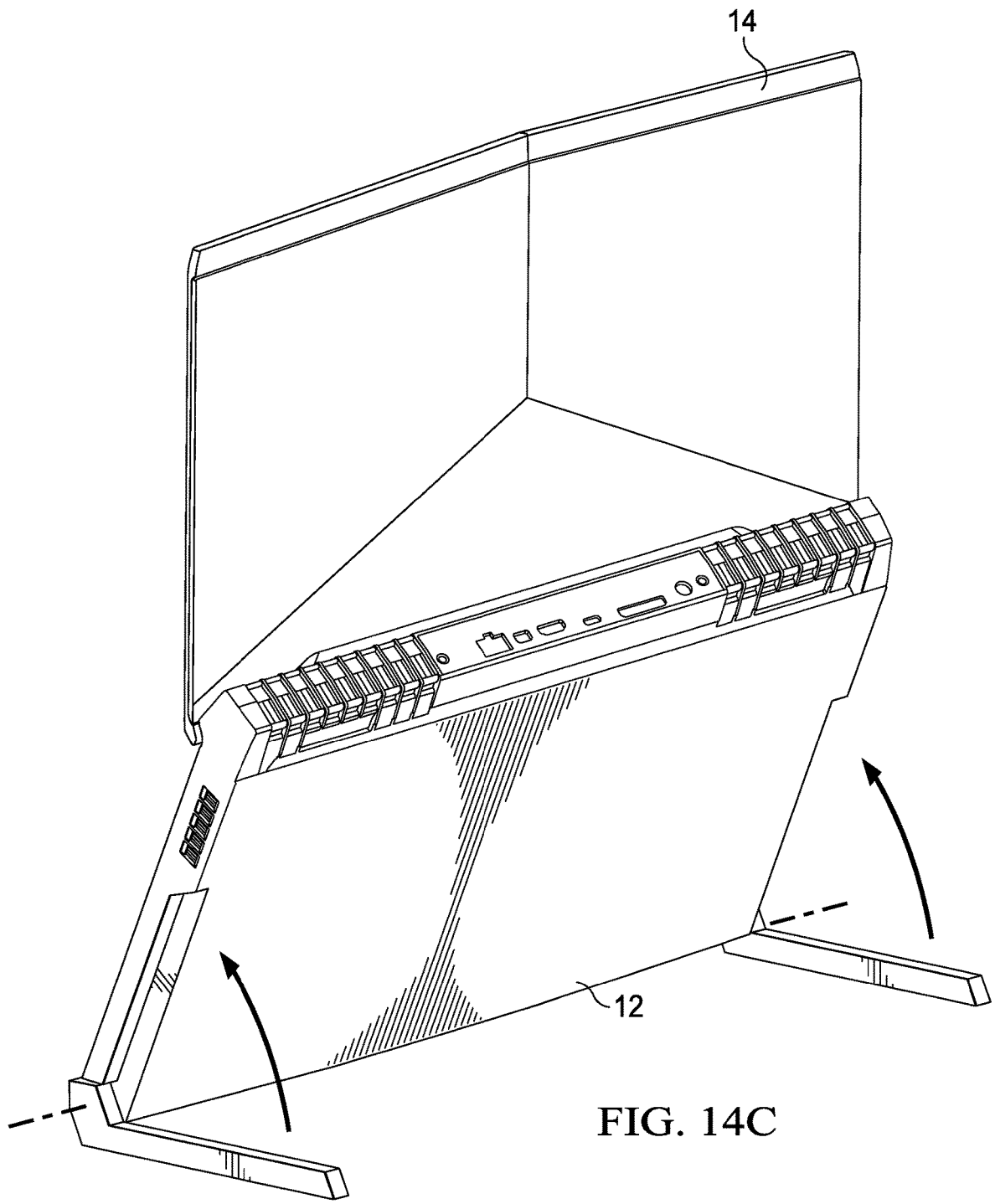

Referring now to FIGS. 14A, 14B and 14C, another alternative embodiment of stand 86 depicts extension about stand hinge 94 located at a front side 36 of main housing 12. Stand 86 in FIG. 14A rotates to a retracted position about stand hinge 94 against lower surface 78 of main housing 12. Upon rotating from the retracted to an extended position, stand 86 rests against support surface 76 to hold main housing 12 in a raised position. In the example embodiment, stand hinge 94 rotates off center to raise front side 36 slightly off support surface 76, thus providing space to allow sound out of a speaker 126 located at the front side 36, as depicted in FIG. 14B. As shown in FIG. 14C, a cavity formed in the sides of main housing 12 provides room to stow stand 86, which extends as two separate pieces on opposing sides of main housing 12. In an alternative embodiment, a single member may act as stand 86 by extending between opposing sides of main housing 12.

Figure 15:
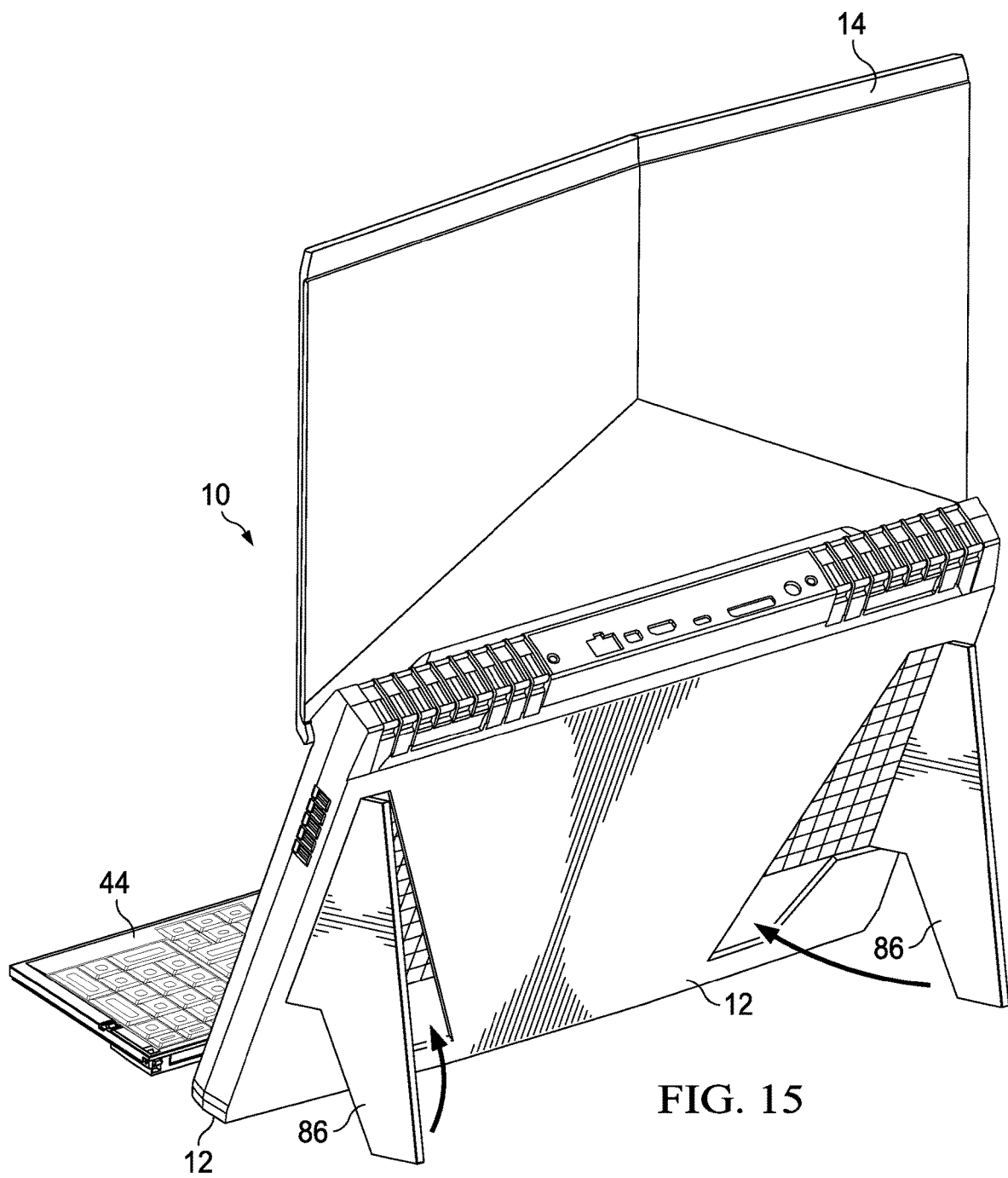
FIG. 15 depicts another alternative embodiment of a stand having extension of opposing side elements from a lower surface of a main housing.

Referring now to FIG. 15, another alternative embodiment of stand 86 depicts extension of opposing side elements from a lower surface 78 of main housing 12. In the example embodiment, stand 86 has first and second rotating elements on opposing sides of main housing 12 that rotate from a retracted position at a center of main housing 12 about a pivot axis on the outer edge at opposing sides of main housing 12. In various embodiments, each element of stand 86 may rotate by greater than 90 degrees so that in the open position torque from resting against support surface 76 works against a closing of stand 86.

Figure 16A:
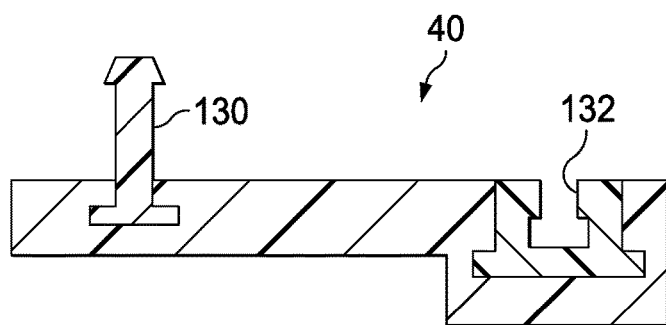
FIGS. 16A, 16B, 16C, 16D, and 16E depict a dual purpose foot that aids in stabilization of an information handling system in both a clamshell and an all-in-one configuration.
Figure 16B:
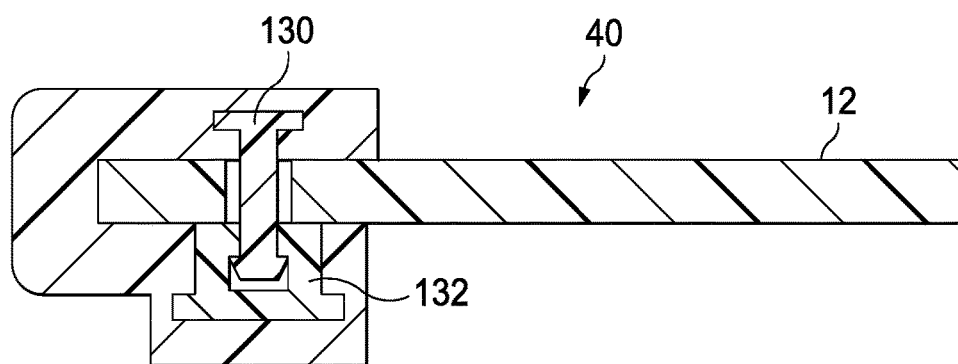
Figure 16C:
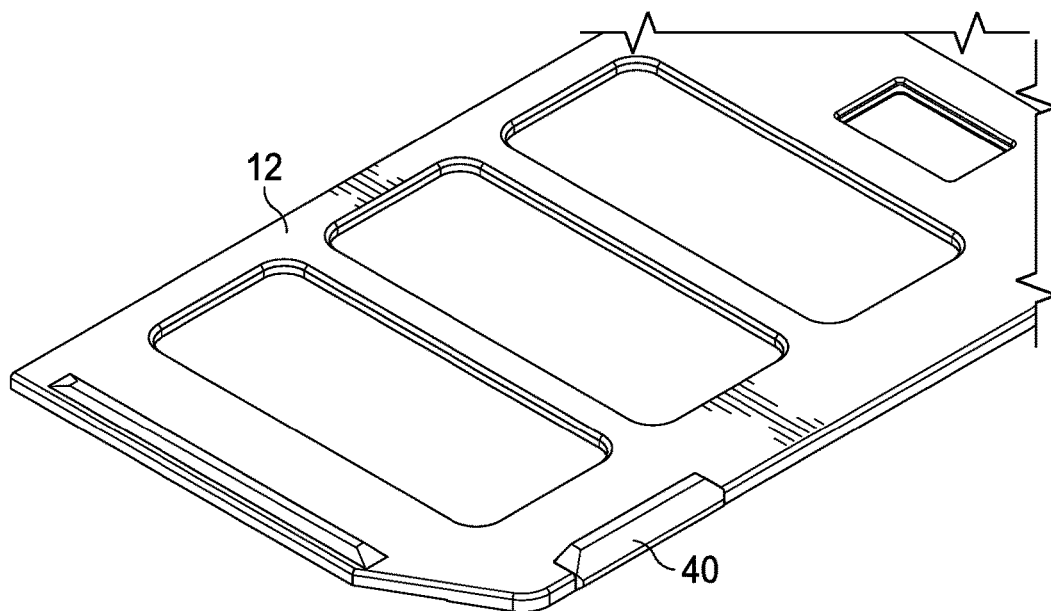
Figure 16D:
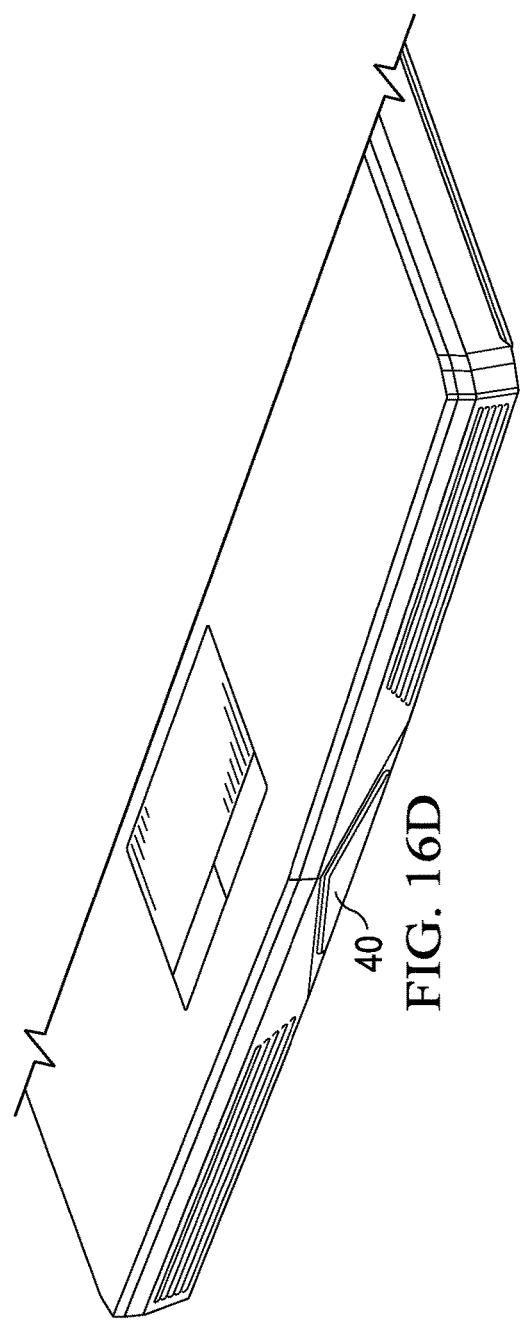
Figure 16E:
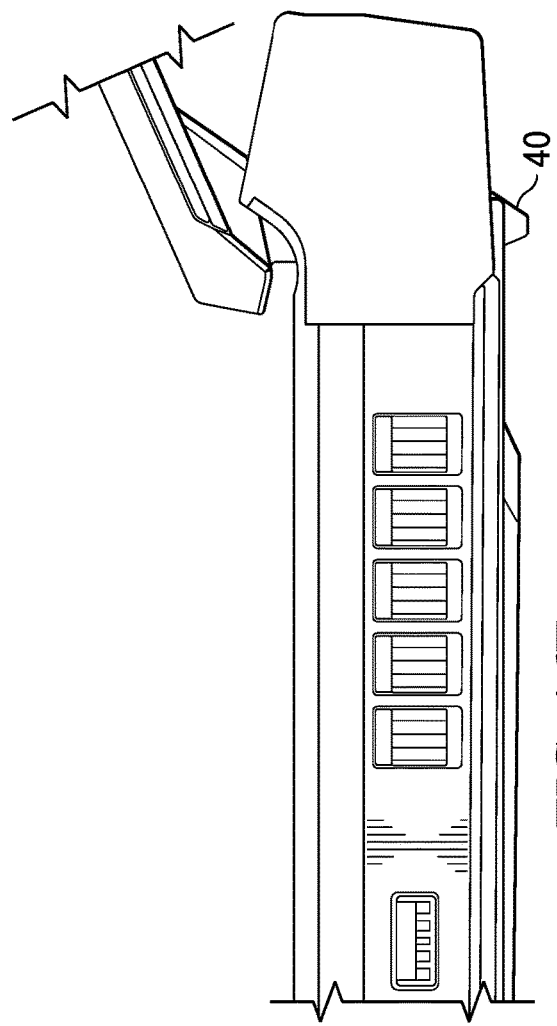

Referring now to FIGS. 16A-16F, a dual purpose foot is depicted that aids in stabilization of information handling system 10 in both a clamshell and an all-in-one configuration. FIG. 16A depicts foot 40 as manufactured from an injection mold with a connector tip 130 and receptacle 132 made from a hardened plastic while the remainder of the body is made from a rubberized plastic. As an example, foot 40 is manufactured with a two-shot injection molding process so that connector tip 130 and receptacle 132 snap into each other. FIG. 16B depicts foot 40 engages over a portion of main housing 12 or stand 86. Connector tip 130 inserts through an opening in main housing 12 while the body of foot 40 wraps around to an opposite side to align receptacle 132 with connector tip 130. Connector tip 130 clips into position in receptacle 132 to hold foot 40 in place around an edge of main housing 12. FIG. 16C depicts a foot 40 coupled to stand 86 with a rubberized plastic material exposed at the edge of stand 86 to engage against a support surface 76 when stand 86 is extended or retracted. FIGS. 16D and 16E depict foot 40 installed at a front and rear location of information handling system 10. FIG. 16F depicts that foot 40 installed at the front and rear locations provides a dual purpose of stable support against a support surface 76 both in the clamshell and all-in-one positions. Wrapping the rubberized plastic of foot 40 around the edge of each supporting face aligns the foot edge to fully engage a support surface 76 in both configurations.

Figure 17:
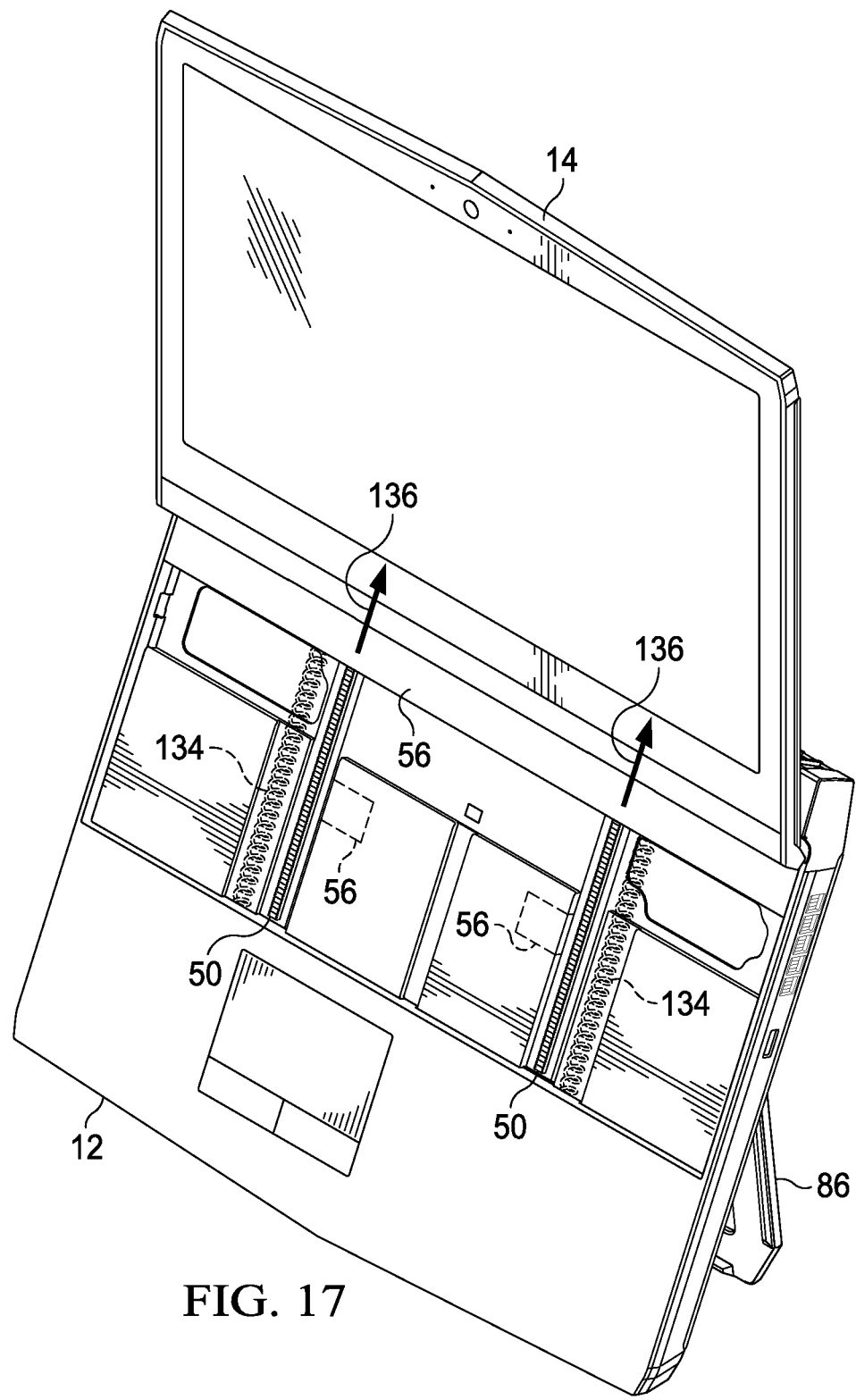
FIG. 17 depicts a front perspective cutaway view of an information handling system in an all-in-one position having a display biased upward by internal tension springs.

Referring now to FIG. 17, a front perspective cutaway view depicts information handling system 10 in an all-in-one position having display 14 biased upward by internal tension springs 134. In the all-in-one position, the weight of display housing 14 presses downward relative to main housing 12 as stand 86 lifts main housing 12 away from support surface 76. In the event that an end user desires to adjust the height of display housing 14 relative to main housing 12, the weight of display housing 14 can result in excessive downward movement speed or awkward upward movement. Biasing spring 134 offsets part of the weight of display housing 14 so that on release of brake 56 display housing 14 will remain largely stationary with bias indicated in the direction of arrows 136. Biasing spring 134 allows a reduced end user force to slide display housing 14 relative to main housing 12. In one alternative embodiment, the biasing force provided by biasing spring 134 is reduced when stand 86 is retracted so that display housing 14 has reduced bias in a horizontal disposition, such as a clamshell mode.

Figure 18:
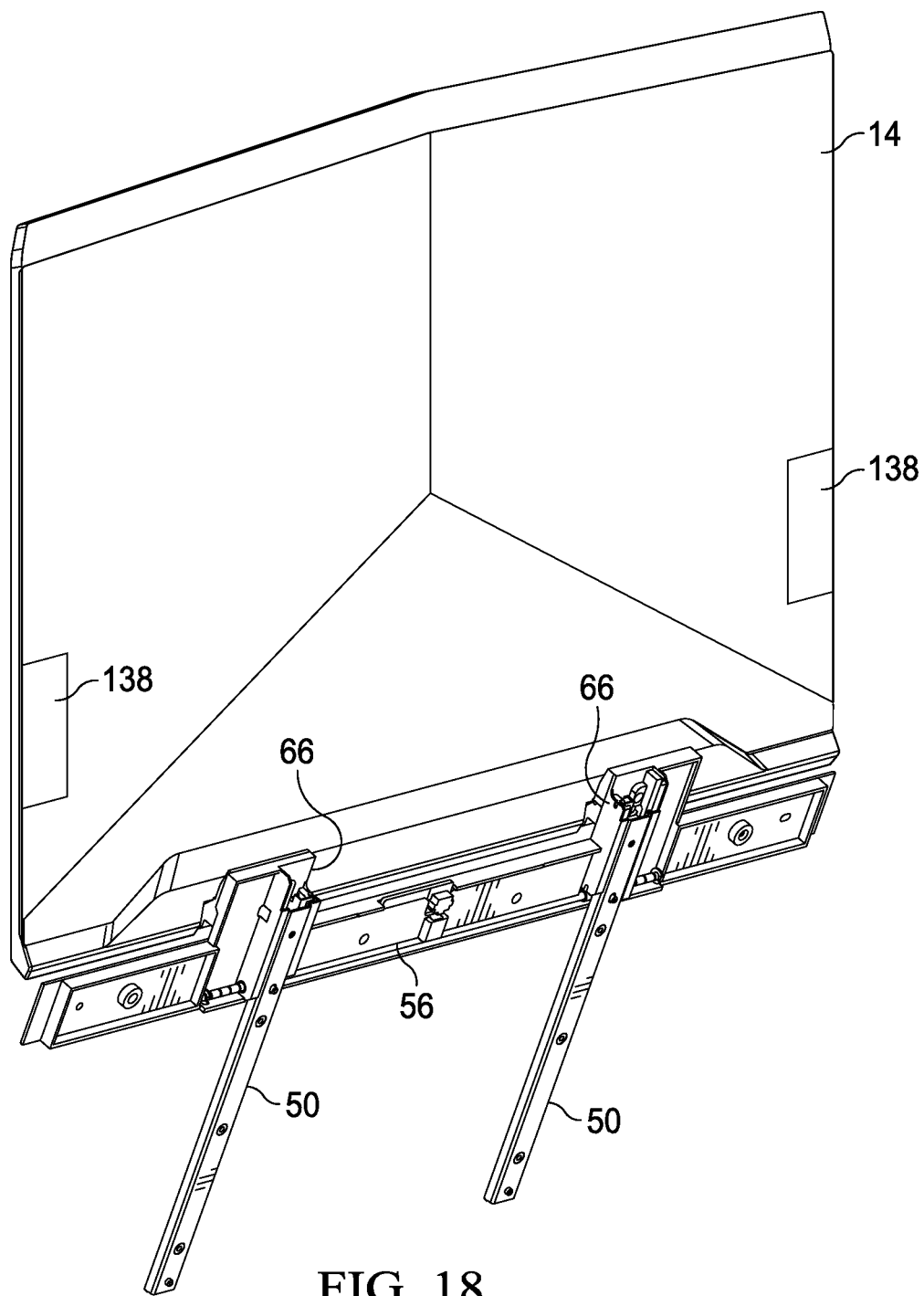
FIG. 18 depicts a rear perspective view of a display housing configured to selectively apply a brake to display vertical positioning.

Referring now to FIG. 18, a rear perspective view depicts a display housing 14 configured to selectively apply a brake 56 to adjust display vertical positioning. In the example embodiment, two brake switches are disposed on opposing sides of display housing 14 that, when pressed simultaneously, disengage brake 56 at rail tracks 50 to allow movement of display housing 14 along rail tracks 50. Brake 50 is a horizontal member that extends across both rail tracks 50 to bias in a pressed position against rails tracks 50 that impedes sliding motion of display housing 14. In one example embodiment, brake 50 is also interfaced with hinges 66 to lock display housing 14 in place unless the rotation of display housing 14 exceeds a predetermined amount, such as 90 or 135 degrees. In combination with biasing spring 134, brake 56 keeps a constant torque or resistance throughout the travel of display housing 14 with sufficient torque to hold display housing 14 in position when lifted vertically by stand 86, yet a light pressure is applied to translate movement to display housing 14 when brake 56 is released.

Figure 19:
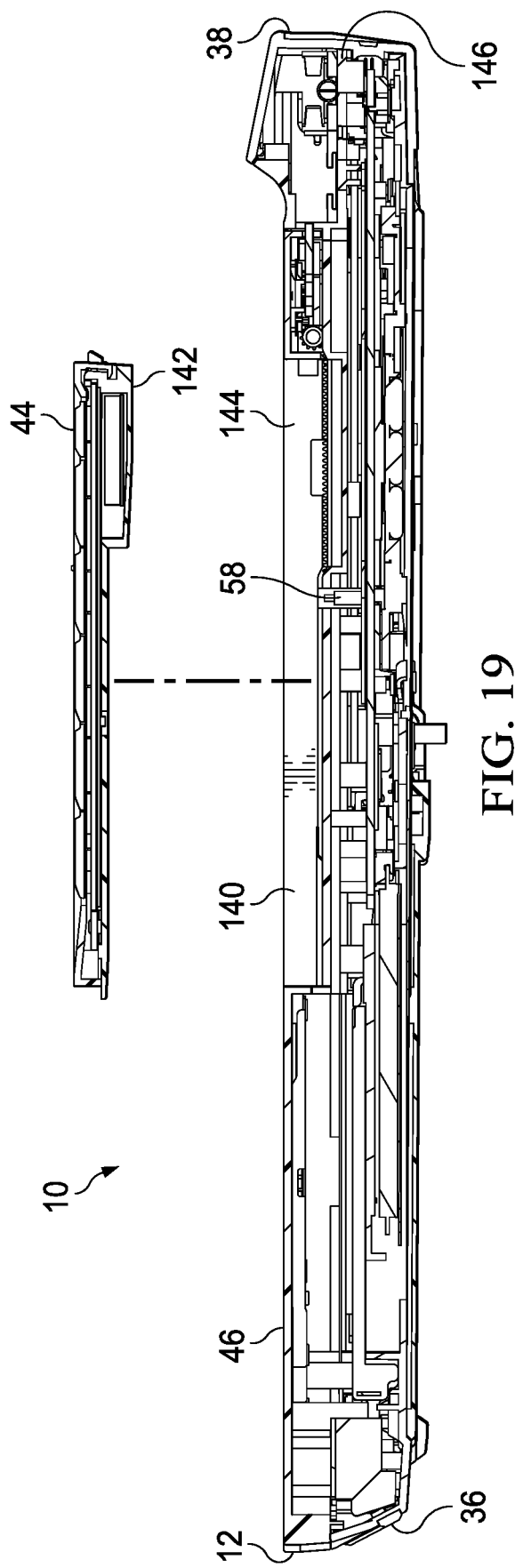
FIG. 19 depicts a side cutaway view of an information handling system configured to attach and detach a keyboard at a keyboard cavity.

Referring now to FIG. 19, a side cutaway view depicts information handling system 10 configured to attach and detach a keyboard 44 at a keyboard cavity 140. Keyboard 44 has a connector 142 disposed on a lower surface that is sized to fit into a keyboard port 144 formed in keyboard cavity 140. Connector 142 is sized to fit into port 144 with a structurally guided alignment, such as based upon a position of keyboard 44 within cavity 140. In the example embodiment, keyboard retainer/ejector 58 is a solenoid that retracts inward at a downward press of keyboard 44 and extends outward to push keyboard 44 out of cavity 140 in response to a command from keyboard controller 22. In alternative embodiments, other types of devices and structures may be used to assist in removal of keyboard 44 from cavity 140. For example, a superelastic wire that shrinks in response to a current that generates heat and an associated phase change may pop keyboard 44 out of cavity 140 by pulling upwards a lever or other structure. As another example, magnets with aligned opposing polarity may hold keyboard 44 in cavity 140 with a misalignment, such as with a sliding motion, placing like polarities in alignment to motivate keyboard 44 out of cavity 140.

In the example embodiment, keyboard cavity 140 defines a scope of sliding motion of display housing 14 between palm rest 46 and vents 82 located at the upper surface of main housing 12 at rear side 38. Keyboard 44 restricts motion of display housing 14 while installed in keyboard cavity 140. In addition, brake 56 may restrict sliding motion of display housing 14 while keyboard 44 is installed in keyboard cavity 140. In one embodiment, activating solenoid 58 releases brake 56 to provide sliding motion of display housing 14. In an alternative embodiment, brake 56 is released or locked based upon the presence of keyboard 44 in cavity 140 and accelerations detected at main housing 12. For instance, if main housing 12 is in a horizontal orientation as detected by accelerometers 30 with keyboard 44 installed in cavity 140, then biasing spring 134 engages to bias display housing 14 to rear side 38 and brake 56 engages to restrict motion of display housing 14. Once keyboard 44 is removed from cavity 140, biasing spring 134 is released, such as with motion by solenoid 58, as is brake 56 so that display housing 14 slides along its pivot axis 72 across keyboard cavity 140 to support transformation to the all-in-one configuration. As accelerometers 30 detect a change in orientation of main housing 12, biasing spring 134 and brake 56 engage as described above to adapt display housing 14 movement to the vertical orientation.

In the example embodiment, a display cable manager 146 integrates in main housing 12 at rear side 38 to manage wired communications between main housing 12 and display housing 14 during sliding motion of display housing 14 within keyboard cavity 140. For instance, display cable manager 146 releases and retracts a display cable that interfaces with display housing 14 along each rail track 50. Slack in the display cables is kept to a minimum to avoid kinking that might occur if a cable gets caught in moving elements.

Figure 20:
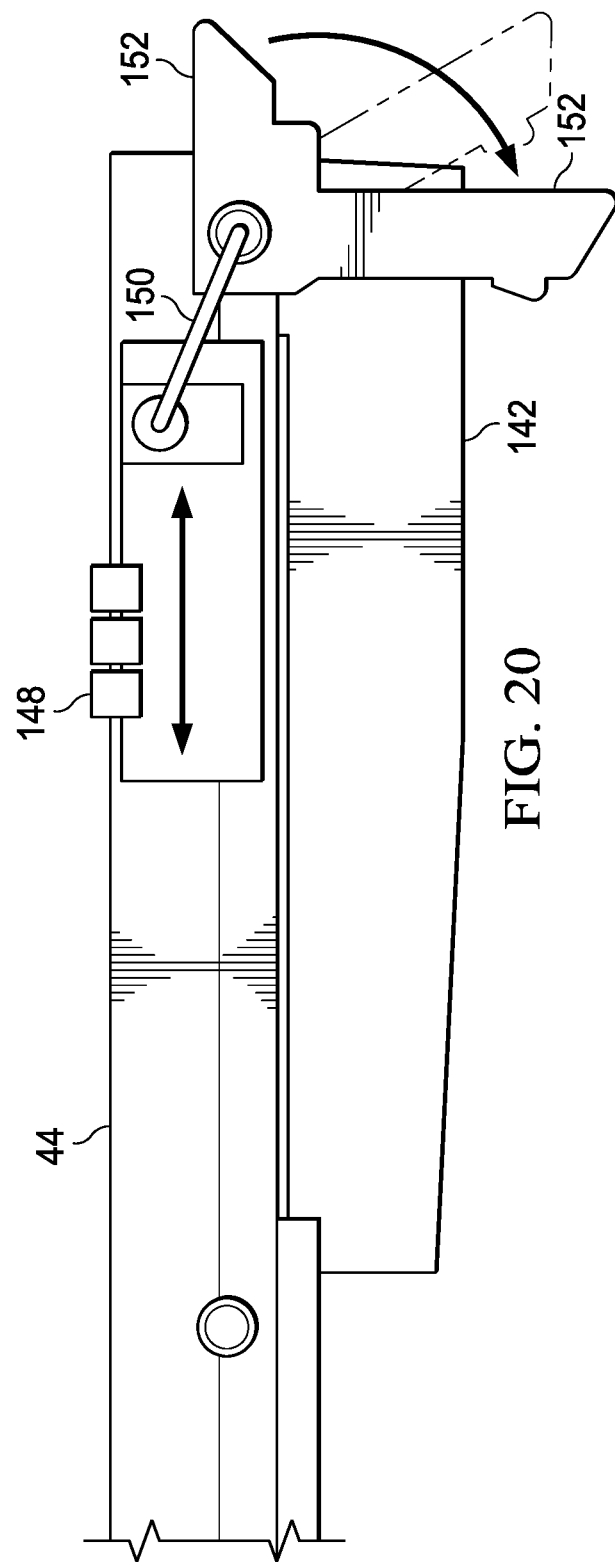
FIG. 20 depicts a side cutaway view of a keyboard having variable foot positions provided after removal from a keyboard cavity.

Referring now to FIG. 20, a side cutaway view of keyboard 44 depicts variable foot positions provided after removal from keyboard cavity 140. Keyboard connector 142 rests on support surface 76 as a base elevation support. A sliding latch 148 slides forward and backwards to control a position of variable position foot 152 through a linkage 158. In the example embodiment, variable height foot 152 has three settings that provide variable keyboard elevation. The lowest setting is provided at withdrawal of keyboard 44 from cavity 140 by retraction of variable height foot 152 and resting of the base of connector 142 on support surface 76. An intermediate height is provided by rotation of variable height foot for approximately 60 degrees to raise connector 142 above support surface 76. A fully raised keyboard elevation is provided with 90 degrees of rotation of variable height foot 152. In one example embodiment, variable height foot 152 automatically retracts upon installation of keyboard 44 in keyboard cavity 140.

Figure 21:
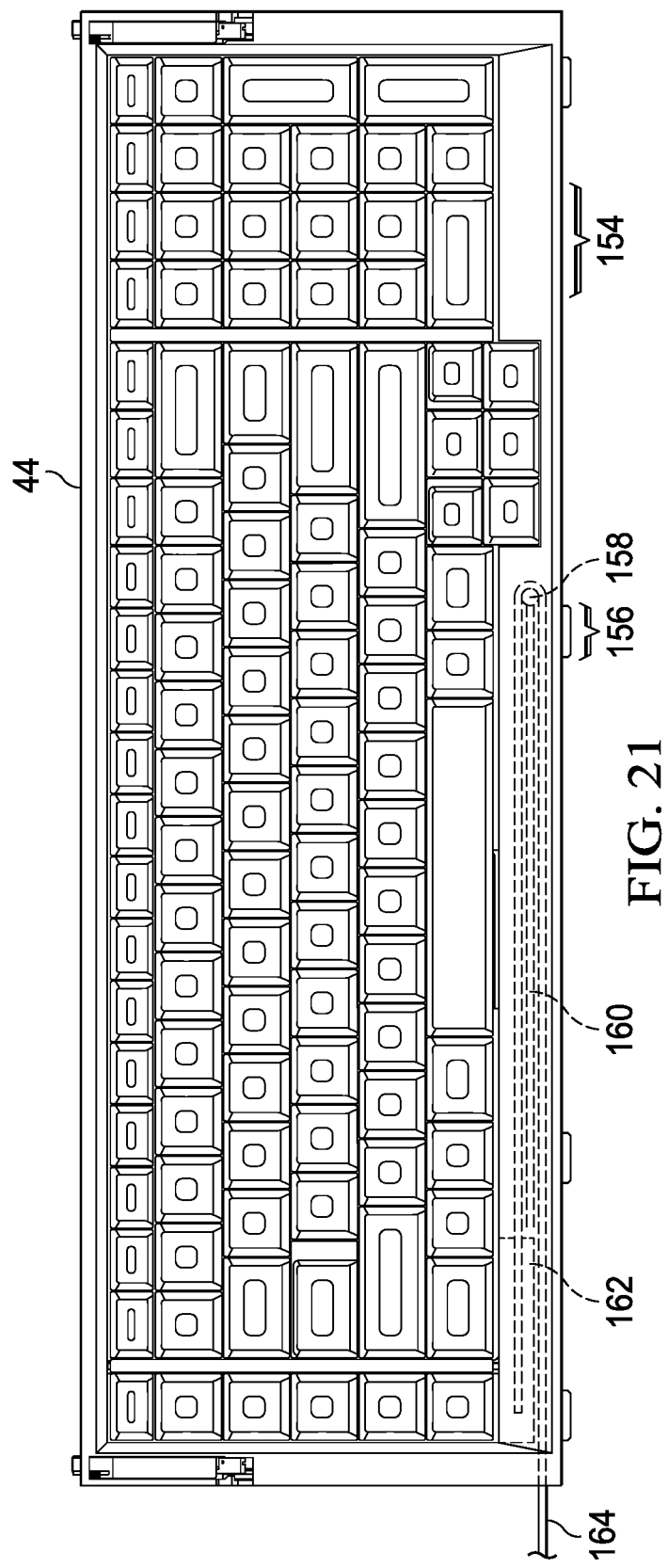
FIG. 21 depicts a top view of a keyboard detached from a keyboard cavity and configured to support keyed inputs through a wired or wireless interface.

Referring now to FIG. 21, a top view depicts keyboard 44 detached from keyboard cavity 140 and configured to support keyed inputs through a wired or wireless interface. In the example embodiment, three different interfaces are made available at keyboard 44 to support communication of keyed inputs to information handling system 10. First, a Bluetooth wireless interface 154 may support communication of keyed inputs both when attached at keyboard cavity 144 and detached from keyboard cavity 144. Second, a cable connector 156 provides a peripheral cable connection that supports wired communication of keyed inputs, such as through a USB Type C cable. Third, an integrated cable 164 included in keyboard 44 selectively extends and retracts from keyboard 44 to maintain a wired keyboard interface as keyboard 44 attaches and detaches from cavity 140. In the example embodiment, integrated cable 164 couples to an interposer 162 around a roller 158 disposed in a roller guide slot 160. Interposer 162 provides a fixed interface with the keyboard membrane within keyboard 44 while cable 164 extends by pulling roller 158 towards interposer 162. Roller 158 is biased away from interposer 162 to aid in retraction of integrated cable 164 upon return on keyboard 44 in keyboard cavity 140.

Figure 22:
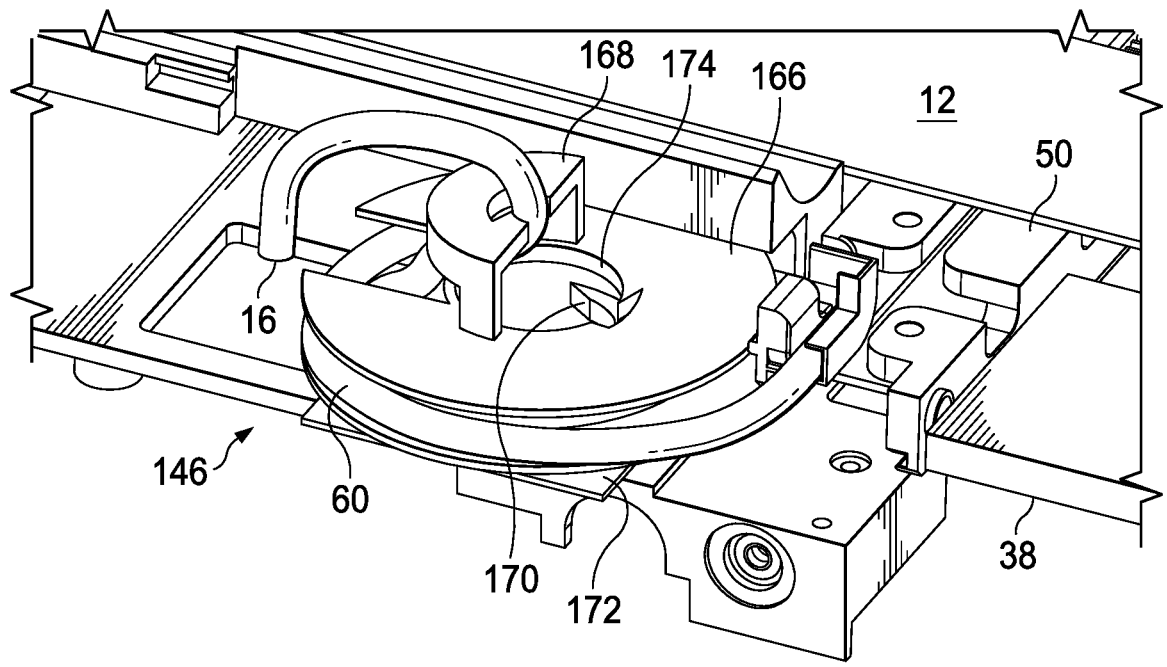
FIG. 22 depicts an upper side perspective view of a display cable manager coupled at a rear side of a main housing to manage display cable extension and retraction in response to sliding movement of a display housing.

Referring now to FIG. 22 an upper side perspective view depicts display cable manager 146 coupled at rear side 38 of main housing 12 to manage display cable 60 extension and retraction in response to sliding movement of display housing 14. Display cable manager 146 wraps display cable 60 proceeding from motherboard 16 and out rail track 50 around a spool 166 to manage how much cable extends as display housing 14 slides down rail track 50. From motherboard 16 to cable restraint 168, display cable 60 is restrained in a fixed manner that reduces forces from transferring through cable 60 to motherboard 16 that could cause cable 60 connection failure. Spool 166 rotates about cable restraint 168 so that excess cable 60 length retracts and extends based upon spool 166 rotational orientation. In one example embodiment, a display cable manager 146 is located at each of opposing sides of main housing 12 to support extension and retraction of a cable along each rail track that supports motion of display housing 14. In one embodiment, spool 166 includes a rotational orientation sensor to measure that amount of extended cable 60. For instance, tracking the amount of cable extension allows changes to thermal parameters at information handling system 10 as additional venting or exhaust capabilities become available due to motion display housing 14.

Figure 23:
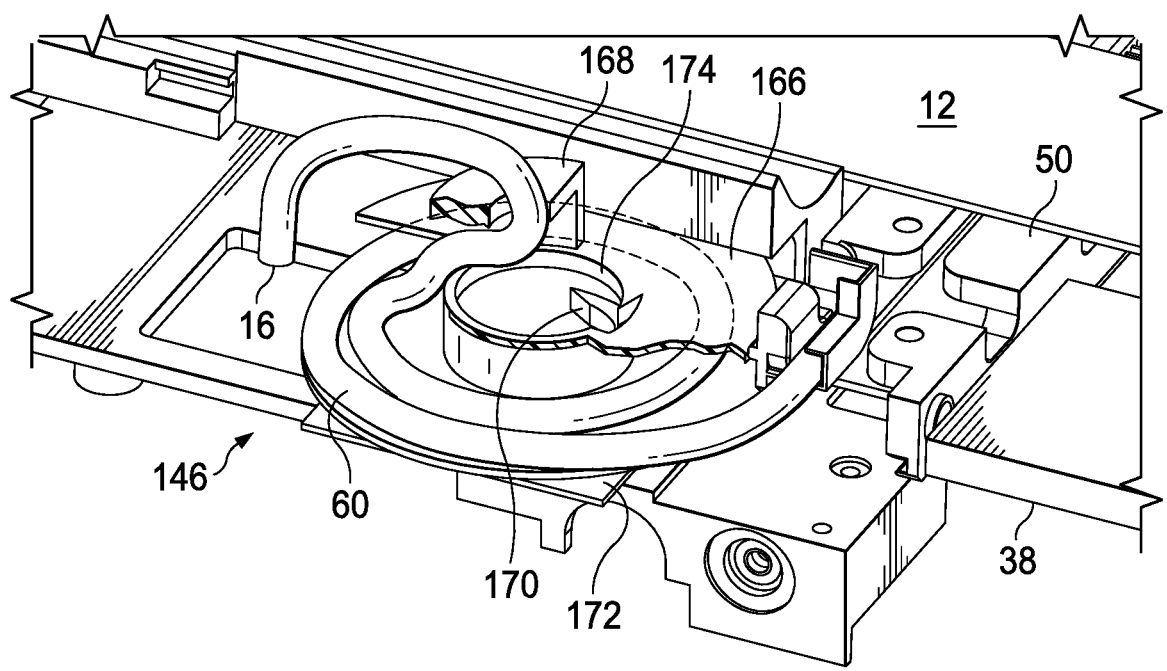
FIG. 23 depicts an upper side perspective cutaway view of an example embodiment of a display cable manager that biases a display cable towards a retracted position.

Referring now to FIG. 23, an upper side perspective cutaway view depicts an example embodiment of display cable manager 146 that biases display cable 60 towards a retracted position. Display cable 60 proceeds from cable restraint 168 to an inner circumference of spool 166 that couples over a fixed spool 174 at a central rotation axis of spool 166. Fixed spool 174 couples to main housing 12 at a mount 172. A rotatory spring 170 biases spool 166 to rotate to a retracted position about fixed spool 174 at which cable 60 retracts to a length that supports a cable connection to display housing 14 at a rear position. Spool 166 unwinds by rotating around fixed spool 174 to feed display cable 60 out rail track 50 as display housing 14 slides away from the rear position towards palm rest 46. Rotary spring 170 keeps some tension on display cable 60 during retraction and extension so that excess cable length does not get caught in rail track 50 as display housing 14 slides.

Figure 24:
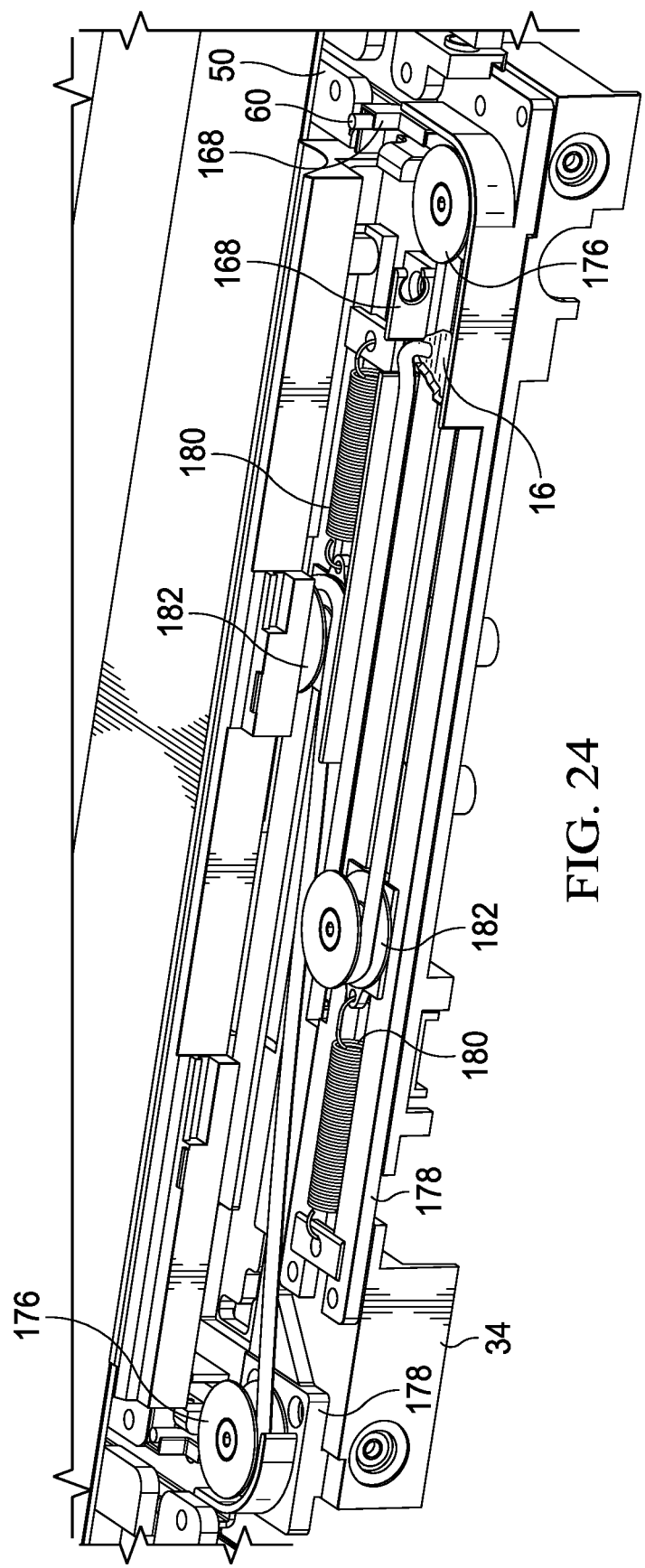
FIG. 24 depicts an upper perspective view of an alternative embodiment of a display cable manager 146 that manages cable extension and retraction along separate rail tracks.

Referring now to FIG. 24, an upper perspective view depicts an alternative embodiment of a display cable manager 146 that manages cable 60 extension and retraction along separate rail tracks 50. Display cable manager 146 is disposed at rear side 38 of main housing 12 to manage cable length down rail tracks 50 with movable pulley spools 182 that maintain cable tension with movement perpendicular to the sliding movement down rail tracks 50. Each cable 60 couples to motherboard 16 at a fixed location near its associated rail track 50 that is held in position by a cable restraint 168. Each cable 60 then proceeds around moveable pulley spool 182 and a fixed spool 176 to proceed out rail track 50. Moveable pulley spool 182 is biased away from fixed spool 176 by a compression spring 180. In the example embodiment, display cable manager 146 is assembled in a mount 178 to fit as a single assembly on main housing 12 at rear side 38 above a cooling fan exhaust. Moveable pulley spool 182 slides within mount 178 to move closer to fixed spool 176 as cable 60 extends and biases away from fixed spool 176 under the influence of compression spring 180 as cable 60 retracts.

Figure 25:
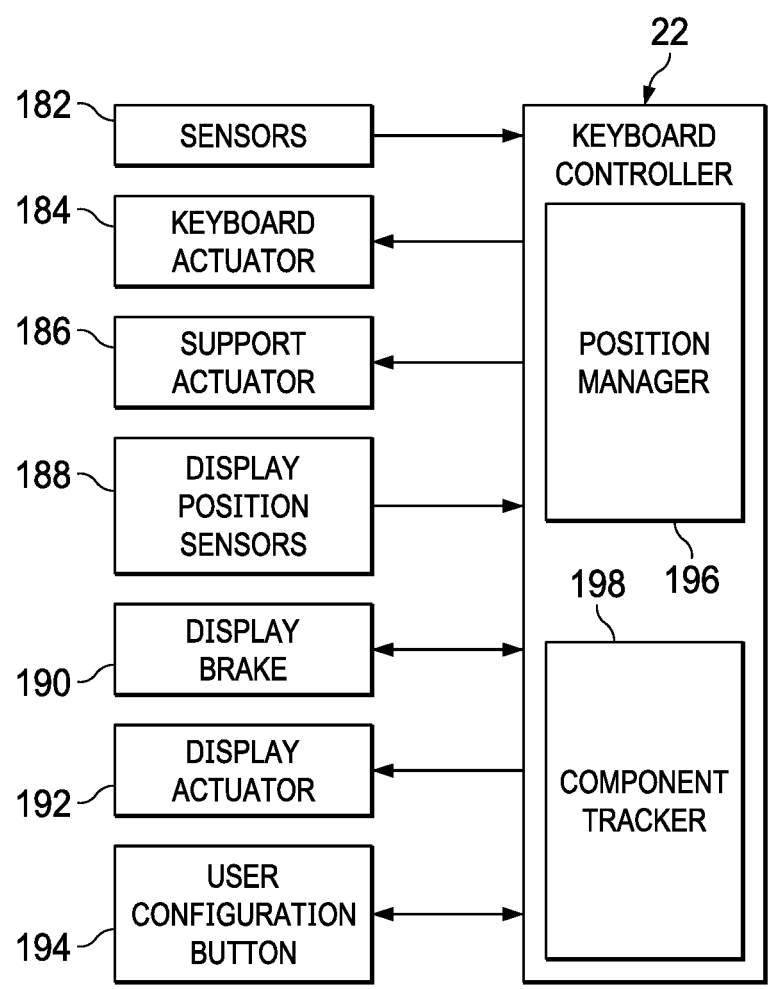
FIG. 25 depicts a block diagram of hardware and logical elements that cooperate to manage transformation of an information handling system between clamshell and all-in-one configurations.

Referring now to FIG. 25, a block diagram depicts hardware and logical elements that cooperate to manage transformation of information handling system 10 between clamshell and all-in-one configurations. In the example embodiment, a keyboard controller 22 stores a position manager 196 and a component tracker 198 in non-transitory memory, such as flash memory, and executes position manager 196 and component tracker 198 to manage information handling system configuration. In various embodiments, other types of controllers or processors may be used to manage system transformation, including an operating system that executes on CPU 18. In the example embodiment, keyboard controller 22 interfaces with other hardware devices through general purpose input/outputs to determine a transformation state of information handling system 10, to command actions at distributed components and to communicate relevant transformation information to an end user.

Keyboard controller 22 interfaces with a variety of sensors 182 that provide a context for determining a transformation state of information handling system 10. Sensors 182 include accelerometers to detect main and display housing orientations and end user movement of portable information handling system 10, ambient light sensors and rotation sensors to detect the rotational orientation of display housing 14 to main housing 12, thermal sensors to detect a thermal state of processing components within main housing 12, infrared and visual cameras that capture images of end users, doppler motion detectors to sense end user hand motions nearby, and other such sensors. Keyboard controller 22 interfaces with a keyboard actuator 184 that actuates keyboard 44 from keyboard cavity 140, such as a solenoid, a superelastic wire, or opposing magnets that alter their polarity alignment. In addition to actuating a keyboard for removal from main housing 12, keyboard actuator 184 may provide feedback to keyboard controller 22 regarding whether a keyboard 44 is disposed in keyboard cavity 140. A support actuator 186 interfaces with keyboard controller 22 to accept commands that initiate extension and/or retraction of stand 86, such as motor interfaced with a stand axis. In addition to actuating motion of stand 86, support actuator 186 may provide feedback regarding the position of stand 86 as extended or retracted. A display position sensor 188 detects the position of a display based upon the display housing configuration, such as the sliding location of the pivot axis 72 and/or the rotational orientation of hinge assembly 80. Display brake 190 is activated and deactivated by keyboard controller 22 to lock and release display housing 14 position relative to main housing 12. A display actuator 192 is commanded by keyboard controller 22 to move display housing 14, such a motor that rotates display housing 14 around hinge assembly 80 or slides display housing 14 pivot axis 72 based upon a selection to transform between clamshell and all-in-one modes. A user configuration button 194 interfaces with keyboard controller 22 to provide an input device that an end user may select to initiate information handling system 10 housing transformations, such as in response to visual cues provided at display 62 by an operating system.

In one embodiment, various aspects of transformation of information handling system 10 between clamshell and all-in-one configurations may be automated by position manager 196. For example, keyboard 44 may be ejected from keyboard cavity 140 with a command to keyboard actuator 184. As an example, keyboard 44 may automatically be released if stand 86 extends or display housing 14 exceeds a preset rotational orientation, such as past 90 or 135 degrees. With sufficient sensors and actuators, information handling system 10 can automatically transform from a clamshell to an all-in-one configuration without end user manipulation of housing elements. Automatic extension might include a button press of voice command that rotates open display housing 14 to 160 degrees, pops out keyboard 44, extends stand 86 to slide keyboard 44 out of cavity 140, and slide pivot axis 72 to an appropriate viewing height. Alternatively, position manager 196 may manually inquire through a displayed user interface in response to a sensed context if a housing transformation step should take place. As an example of some position relationships that may be monitored and enforced by position manager 196, relationships between pivot axis location, stand position and display housing rotational orientation may be considered and applied to determine transformation state. For example, position manager 196 may restrict rotation of display housing 14 to not greater than a preset amount if keyboard 44 is attached to main housing 12. Once keyboard 44 is detached, position manager 196 may allow a greater amount of display housing rotation, such as to prepare for an all-in-one transformation. While keyboard 44 remains attached, position manager 196 locks brake 56 to prevent sliding of pivot axis 72. Position manager 196 may restrict extension of stand 86 unless keyboard 44 first detaches, and may similarly restrict extension of stand 86 until after display housing 14 has greater than a predetermined rotation relative to main housing 12, such as 160 degrees. Upon detection of closing of display housing 14 to a predetermined position, position manager 196 may initiate sliding of pivot axis 72 towards rear side 38 of main housing 12. In one example embodiment, position manager 196 may restrict closing of display housing 14 over main housing 12 unless keyboard 44 is attached to main housing 12.

Component tracker 198 executes on keyboard controller 22 to aid in tracking information handling system components based upon system transformations. In particular, removal of keyboard 44 from main housing 12 invites an opportunity for an end user to close display housing 14 over main housing 12 without a keyboard 44. Alternatively, an incorrect keyboard belonging to a different information handling system may be erroneously included in information handling system 10. Component tracker 198 issues an alert to the end user if an incomplete or incorrect configuration is detected, such as a beep, illumination of an LED or a message presented at display panel 62. Similarly, if an end user attempts to close information handling system 10 with keyboard 44 unsecured, an alert may issue to remind the end user to secure keyboard 44.

Figure 26:
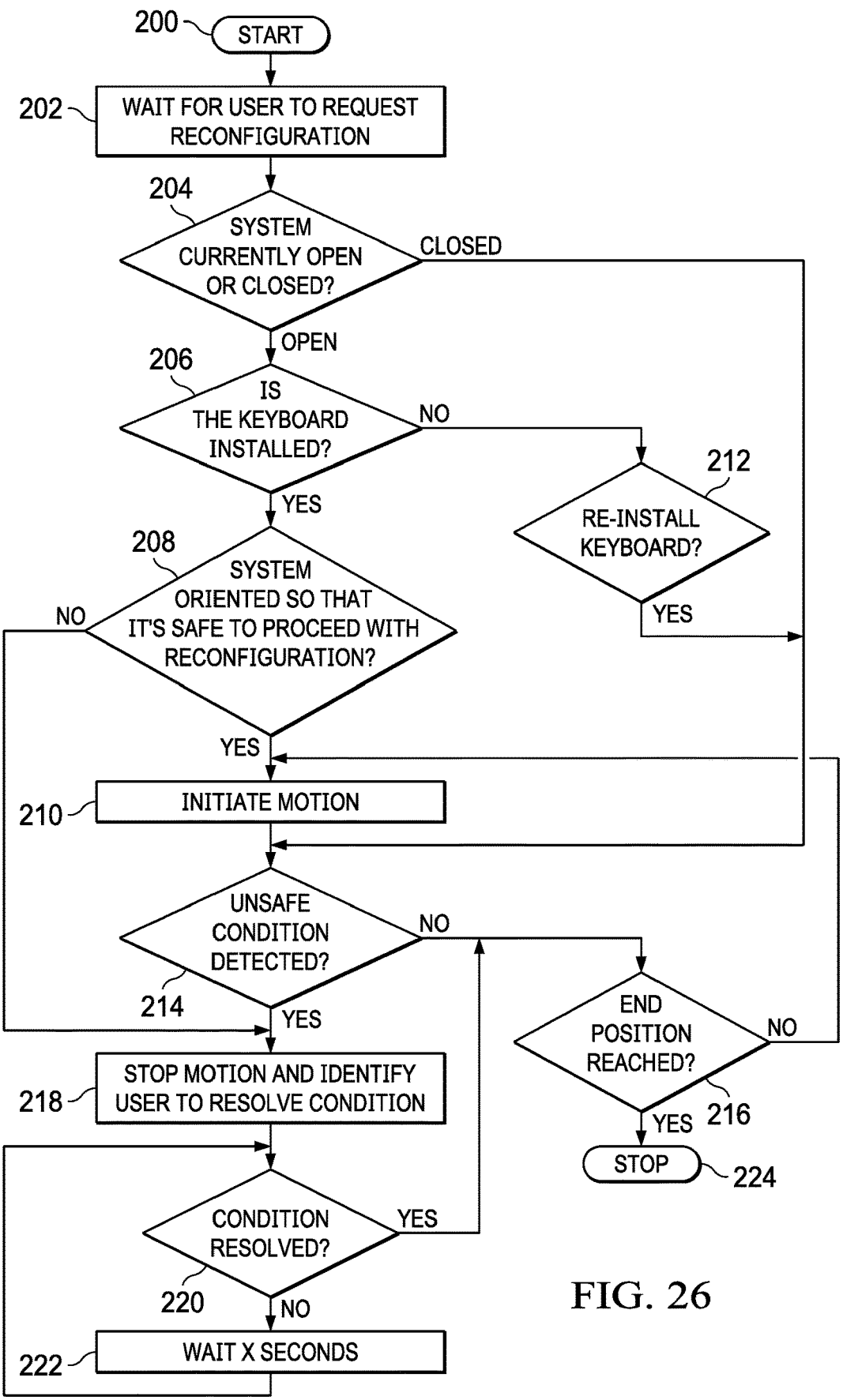
FIG. 26 depicts a flow diagram of a process for automated transformation between clamshell and all-in-one configurations.

Referring now to FIG. 26, a flow diagram depicts a process for automated transformation between clamshell and all-in-one configurations. The process starts at step 200, such as at system power up, and proceeds to step 202 to wait for a user to request a system reconfiguration. If a system reconfiguration is requested at step 202, the process continues to step 204 to determine if main housing 12 and display housing 14 are in an open or closed state. If the housing is in an open state, the process continues to step 206 to determine if the keyboard is attached or detached. If the keyboard is detached, a determination is first made at step 208 if a system orientation exists that will permit a transformation to an all-in-one orientation. If so, the process continues to step 210 to initiate motion to the all-in-one state.

If at step 204 the system is closed or at step 212 the keyboard is attached, the process continues to step 214 to determine whether a condition exists that prevents transformation to an all-in-one configuration. Similarly, from step 210 once movement is initiated to the all-in-one position, the process continues to step 214 to determine if an unsafe condition is detected for transformation to take place. If at step 214 conditions are not satisfactory for transformation to an all-in-one position, the process continues to step 218 to stop motion towards the all-in-one position. Similarly, from step 208, if a condition exists that is not appropriate for transformation to an all-in-one position, the process continues to step 218 to stop motion of the housing towards the all-in-one position. If at step 214, conditions are appropriate to transform to an all-in-one position, the process continues to step 216 to determine if transformation is complete and step 224 if transformation is complete. The process loops from step 216 through step 210 to monitor housing transformation until the transformation is complete.

At step 218, once motion towards transformation is stopped, the process continues to step 220 to determine if the condition that stopped transformation has been resolved. If not, the process loops at step 222 for a predetermined wait time and then returns to step 216. In various embodiments, various system configurations may result in stopping of transformation to an all-in-one position. For example, an actuator may fail to operate that opens the housings, detaches the keyboard or extends the stand. Other difficulties may relate to a position of pivot axis 72 that places the system center of gravity too high to safely extend the stand. In some situations, an actuator might bind or get caught on an expected external blocking element that prevents proper synchronization of the order of all-in-one transformation steps. In one embodiment, the end result of a transformation of information handling system 10 may include a stored configuration for a particular end user, such as a height and rotational orientation of display housing 14 in the all-in-one position.

Figure 27:
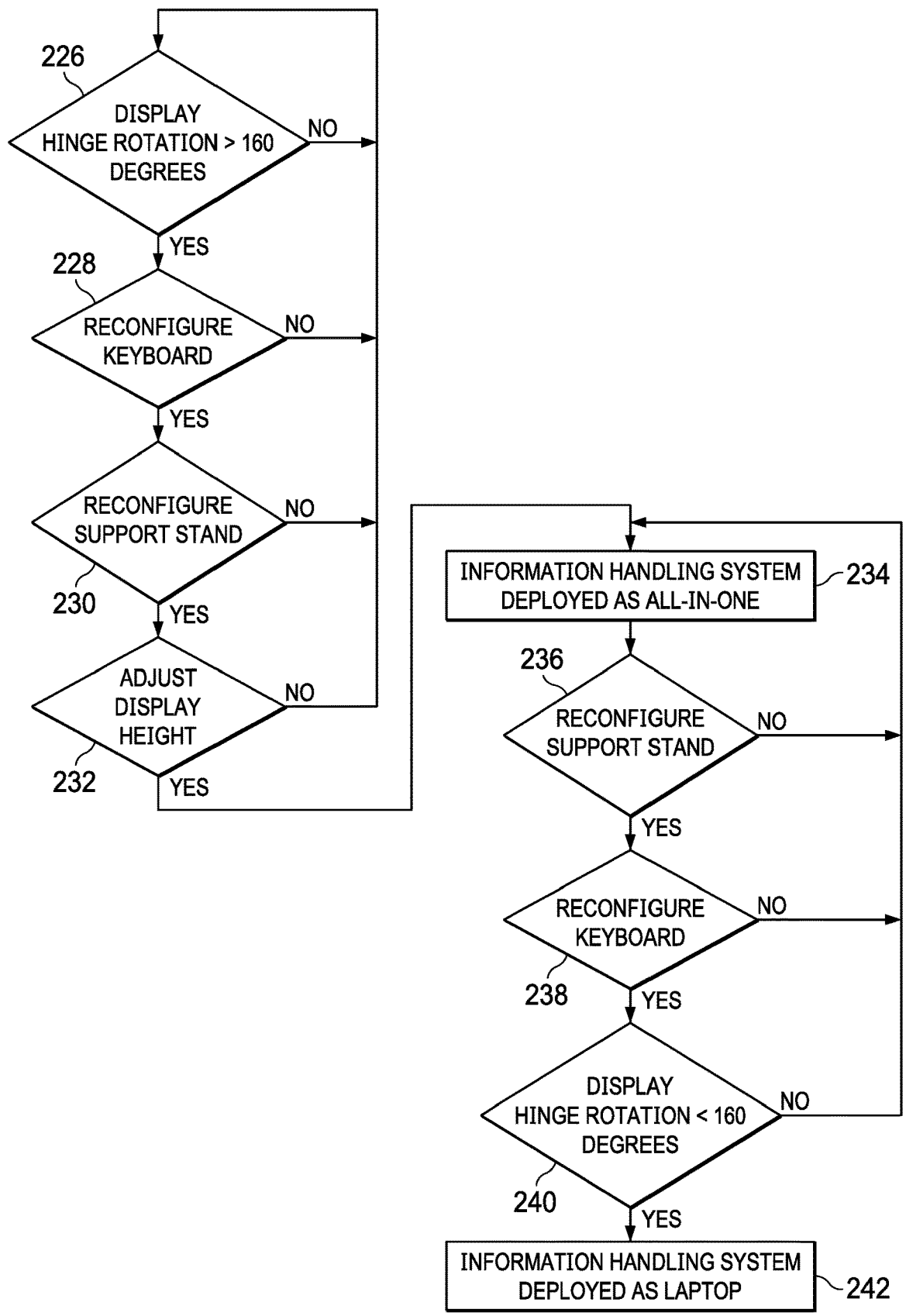
FIG. 27 depicts a flow diagram of a process for manual transformation between clamshell and all-in-one configurations.

Referring now to FIG. 27, a flow diagram depicts a process for manual transformation between clam shell and all-in-one configurations. The process starts at step 226 with detection of display hinge rotation of greater than 160 degrees, which indicates a viewing orientation associated with an all-in-one position. If the display orientation for all-in-one transformation is detected, the process continues to step 228 to determine if a reconfiguration is appropriate by a release of the keyboard. In one embodiment, an end user may be provided with a user interface that inquires if a keyboard release should be initiated, and then a keyboard release is initiated if the end user makes an input, such as a button press. In an alternative embodiment, a keyboard release is performed automatically at detection of the display housing orientation. At step 230, a determination is made of whether to reconfigure the support stand to raise the main housing 12, and at step 232 a determination is made of whether to adjust the display height by changing the pivot axis location. As with step 228, the stand and display height adjustments may be initiated with presentation of an option at a manual button or user interface that an end user selects or with an automated movement based upon sensed context. At step 234, the information handling system deployment completes with a transformation to an all-in-one state.

From step 234, transformation from the all-in-one to the clamshell state is also managed with sensing of system context and interactions with an end user, such as through a push button or a user interface. At step 236, a determination is made of whether to retract a support stand, which will lower the main housing to a horizontal orientation for transition to the clamshell position. A user may initiate the transformation at step 236, such as with a press of the button or user interface or a manual operation. At step 238 a determination is made of whether to reconfigure the keyboard by attaching the keyboard to the housing. For instance, further transformation to the clamshell position by closing the display housing may be restricted until the keyboard is reattached so that the keyboard is not forgotten or lost. At step 240 a determination is made of whether to close the display lid past the all-in-one rotational orientation. As described above, transition to a closed position may be automatically performed based upon an end user input to a touch button or user interface. At step 242 transformation to the clamshell position is completed.

Although the present invention has been described in detail, it should be understood that various changes, substitutions and alterations can be made hereto without departing from the spirit and scope of the invention as defined by the appended claims.

What is claimed is:
1. A portable information handling system comprising:
   a main housing having an upper surface, a lower surface, a front side and a rear side;
   processing components disposed in the main housing cooperating to process information, the processing components including at least a keyboard controller;
   a display housing rotationally coupled to the main housing to rotate between closed and open positions at a pivot axis, the display housing moving the pivot axis along the upper surface between the front side and rear side;
   a display disposed in the display housing to present the information as visual images;
   a stand coupled to the lower surface, the stand having a retracted position and an extended position, the extended position raising the rear side relative to the front side; and
   a position manager executing on the keyboard controller and controlling end user interactions with the display hosing pivot axis and stand based upon one or more predetermined factors.
2. The portable information handling system of claim 1 wherein the position manager restricts rotation of the display housing to not greater than a predetermined rotational orientation about the pivot axis if a keyboard attaches to the upper surface.

3. The portable information handling system of claim 1 wherein the position manager restricts movement of the pivot axis along the upper surface to not greater than a predetermined distance if a keyboard attaches to the upper surface.

4. The portable information handling system of claim 1 wherein the position manager restricts extension of the stand to not greater than a predetermined amount if a keyboard attaches to the upper surface.

5. The portable information handling system of claim 1 wherein the position manager restricts extension of the stand to not greater than a predetermined amount if the display housing has less than a predetermined rotational orientation.

6. The portable information handling system of claim 1 wherein the position manager slides the pivot axis towards the rear side in response to closing of the display housing against the main housing upper surface.

7. The portable information handling system of claim 6 wherein the position manager restricts closing of the display housing against the main housing upper surface unless a keyboard attaches to the upper surface.

8. The portable information handling system of claim 7 further comprising a component tracker executing on the keyboard controller and issuing an alert if the display housing closes over the main housing upper surface unless a predetermined component attaches to the main housing.

9. The portable information handling system of claim 8 wherein the predetermined component comprises a keyboard.

10. A method for transforming a portable information handling system to a vertical configuration, the method comprising:

removing a keyboard from an upper surface of a main housing of the portable information handling system;

sliding a display housing from a rear position at the main housing to a front position;

extending a stand from a bottom surface of the main housing to raise a rear side of the main housing; and restricting one or more of the sliding and extending based upon one or more predetermined conditions.

11. The method of claim 10 further comprising restricting the sliding if the keyboard couples to the main housing upper surface.

12. The method of claim 10 further comprising restricting rotation of the display housing to not greater than a predetermined rotational orientation if the keyboard couples to the main housing upper surface.

13. The method of claim 10 further comprising restricting extension of the stand to not greater than a predetermined amount if the keyboard couples to the main housing.

14. The method of claim 10 further comprising automatically detaching the keyboard from the main housing upper surface if the display rotates past a predetermined rotational orientation.

15. The method of claim 10 further comprising restricting extension of the stand to not greater than a predetermined amount until after the sliding the display housing.

16. The method of claim 10 further comprising restricting extension of the stand to not greater than a predetermined amount until the display housing front position is closer to the main housing front side than a stand hinge that rotates the stand to an extended position.

17. The method of claim 10 further comprising restricting rotation of the display to less than a predetermined open rotational orientation if the stand has an extended position.

18. The method of claim 10 further comprising restricting rotation of the display to less than a predetermined open rotational orientation if the keyboard is detached from the main housing.

* * * * *